(12) United States Patent
Chan et al.

(10) Patent No.: US 7,691,688 B2
(45) Date of Patent: Apr. 6, 2010

(54) STRAINED SILICON CMOS ON HYBRID CRYSTAL ORIENTATIONS

(75) Inventors: Kevin K. Chan, Staten Island, NY (US); Meikei Ieong, Wappingers Falls, NY (US); Alexander Reznicek, Mount Kisco, NY (US); Devendra K. Sadana, Pleasantville, NY (US); Leathen Shi, Yorktown Heights, NY (US); Min Yang, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/143,912

(22) Filed: Jun. 23, 2008

(65) Prior Publication Data
US 2008/0254594 A1 Oct. 16, 2008

Related U.S. Application Data

(60) Continuation of application No. 11/492,271, filed on Jul. 25, 2006, now Pat. No. 7,402,466, which is a division of application No. 10/830,347, filed on Apr. 22, 2004, now Pat. No. 7,087,965.

(51) Int. Cl.
*H01L 21/00* (2006.01)

(52) U.S. Cl. .................. 438/150; 438/166; 438/187; 438/198; 438/199; 438/486; 257/347; 257/348; 257/349; 257/350; 257/351; 257/352; 257/353; 257/354; 257/482; 257/627; 257/628; 257/E29.003; 257/E29.004; 257/E29.298; 257/E21.036; 257/E21.233

(58) Field of Classification Search .................. 438/150, 438/166, 168, 187, 198, 199, 486; 257/E29.003, 257/E21.036, 233, 347–354, 482, 627, 628, 257/4, 298
See application file for complete search history.

(56) References Cited

U.S. PATENT DOCUMENTS

| | | |
|---|---|---|
| 5,387,888 A | 2/1995 | Eda et al. |
| 5,998,807 A | 12/1999 | Lustig et al. |
| 6,160,597 A | 12/2000 | Schadt et al. |
| 6,515,335 B1 | 2/2003 | Christiansen et al. |
| 6,639,280 B2 | 10/2003 | Sugatani et al. |
| 6,830,976 B2 | 12/2004 | Fitzgerald et al. |
| 6,995,430 B2 | 2/2006 | Langdo et al. |

(Continued)

FOREIGN PATENT DOCUMENTS

JP 04-372166 12/1992

(Continued)

*Primary Examiner*—Charles D Garber
*Assistant Examiner*—Yasser A Abdelaziez
(74) *Attorney, Agent, or Firm*—Scully, Scott, Murphy & Presser, P.C.; Vazken Alexanian

(57) ABSTRACT

Methods of forming a strained Si-containing hybrid substrate are provided as well as the strained Si-containing hybrid substrate formed by the methods. In the methods of the present invention, a strained Si layer is formed overlying a regrown semiconductor material, a second semiconducting layer, or both. In accordance with the present invention, the strained Si layer has the same crystallographic orientation as either the regrown semiconductor layer or the second semiconducting layer. The methods provide a hybrid substrate in which at least one of the device layers includes strained Si.

18 Claims, 22 Drawing Sheets

U.S. PATENT DOCUMENTS

| | | |
|---|---|---|
| 7,023,055 B2 * | 4/2006 | Ieong et al. ............ 257/369 |
| 7,230,557 B1 | 4/2006 | Ieong et al. |
| 7,087,965 B2 * | 8/2006 | Chan et al. ............ 257/347 |
| 7,329,923 B2 * | 2/2008 | Doris et al. ............ 257/347 |
| 7,364,958 B2 * | 4/2008 | Ieong et al. ............ 438/198 |
| 7,402,466 B2 * | 7/2008 | Chan et al. ............ 438/149 |
| 2002/0033521 A1 | 3/2002 | Matsuoka |
| 2003/0015709 A1 | 1/2003 | Emrick et al. |
| 2004/0256700 A1 | 12/2004 | Doris et al. |
| 2005/0093104 A1 | 5/2005 | Ieong |
| 2006/0231899 A1 | 10/2006 | Chang et al. |
| 2007/0262361 A1 | 11/2007 | Zhu et al. |
| 2008/0009114 A1 | 1/2008 | Bernstein et al. |
| 2008/0036028 A1 | 2/2008 | Chan et al. |

FOREIGN PATENT DOCUMENTS

| | | |
|---|---|---|
| JP | 2005-244020 | 12/1997 |
| JP | H09-219524 | 3/1998 |
| JP | 10092947 | 4/1998 |
| JP | H11-017001 | 1/1999 |
| JP | 2001-338988 | 12/2001 |
| JP | 2003-100900 | 4/2003 |
| JP | 2004-040122 | 2/2004 |

* cited by examiner

STRAINED SILICON CMOS ON HYBRID CRYSTAL ORIENTATIONS

RELATED APPLICATIONS

This application is a continuation of U.S. application Ser. No. 11/492,271, filed Jul. 25, 2006, which is a divisional of U.S. application Ser. No. 10/830,347, filed Apr. 22, 2004, now U.S. Pat. No. 7,087,965, issued on Aug. 8, 2006. This application is related to and co-assigned U.S. patent application Ser. No. 10/250,241, filed Jun. 17, 2003, now U.S. Pat. No. 7,329,923, issued on Feb. 12, 2008, and co-assigned U.S. patent application Ser. No. 10/696,634, filed Oct. 29, 2003, now U.S. Pat. No. 7,023,055, issued on Apr. 4, 2006, the entire contents of each of the aforementioned U.S. Applications are incorporated herein by reference.

FIELD OF THE INVENTION

The present invention relates to high-performance metal oxide semiconductor field effect transistors (MOSFETs) for digital or analog applications, and more particularly to MOSFETs utilizing carrier mobility enhancement from surface orientation.

BACKGROUND OF THE INVENTION

In present semiconductor technology, CMOS devices, such as nFETs or pFETs, are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above discussion, the (110) Si surface is optimal for pFET devices because of excellent hole mobility, yet such a crystal orientation is completely inappropriate for NFET devices. Instead, the (100) Si surface is optimal for nFET devices since that crystal orientation favors electron mobility.

Co-pending and co-assigned U.S. patent application Ser. No. 10/250,241, filed Jun. 17, 2003, provides an approach to fabricate CMOS devices on hybrid orientations wherein the pFETs are formed on a (110) surface orientation and nFETs are formed on a (100) surface orientation. Because hole mobility is greater than 150% higher on (110) orientation than on (100) orientation, the performance of pFETs is greatly enhanced from conventional CMOS technology. Despite the enhancement, the nFETs remain the same as conventional CMOS.

In view of the above, there is a need for providing integrated semiconductor devices that are formed upon a substrate having different crystal orientations that provide enhanced device performance for a specific type of device. The enhanced device performance is required for both nFETs and pFETs thereby improving upon the technology described in co-pending and co-assigned U.S. application Ser. No. 10/250,241.

SUMMARY OF THE INVENTION

One object of the present invention is to provide a method of integrating semiconductor devices such that different types of devices are formed upon a specific crystal orientation of a hybrid substrate that enhances the performance of each type of device.

Another object of the present invention is to provide a method of integrating semiconductor devices such that the pFETs are located on a (110) crystallographic plane, while the nFETs are located on a (100) crystallographic plane of a hybrid substrate.

A further object of the present invention is to improve the device performance of nFETs and farther enhance the device performance of pFETs using a hybrid crystal orientated substrate that includes strained Si as an upper device layer in which nFETs and/or pFETs can be fabricated.

A still further object of the present invention is to provide a method of fabricating a strained Si-containing hybrid substrate having different crystal orientations in which one device has bulk-like properties and the other device has SOI-like properties.

An even further object of the present invention is to provide a method of fabricating a strained Si-containing hybrid substrate having different crystal orientations in which the devices formed thereon each have SOI-like properties.

These and other objects and advantages are achieved in the present invention by utilizing methods in which a hybrid substrate comprising first and second semiconducting layers having different crystal orientations is first provided. After providing the hybrid substrate having different crystal orientations, the substrate is subjected to patterning, etching and regrowth of a semiconductor layer. A strained Si layer can be formed before the patterning step such that the strained Si layer has the same crystallographic orientation as the second semiconducting layer and/or it can be formed after regrowth so that the strained Si layer has the same crystallographic orientation as the first semiconducting layer. Following these steps, isolation regions can be formed and semiconductor devices can be formed atop the strained Si-containing hybrid substrate.

In broad terms, the present invention provides a method of forming a strained Si-containing hybrid substrate that comprises the steps of:

providing a hybrid substrate comprising a first semiconducting layer of a first crystallographic orientation, a buried insulating layer located on a surface of the first semiconductor layer and a second semiconducting layer of a second crystallographic orientation which is different from the first crystallographic orientation located on said buried insulating layer;

providing an opening the extends to a surface of the first semiconducting layer; and regrowing a semiconductor material on said first semiconducting layer in said opening, said semiconductor material having the first crystallographic orientation, with the proviso that a strained Si layer is formed overlying at least one of the second semiconducting layer or the regrown semiconductor material, said Si layer having a crystallographic orientation that matches that of said underlying second semiconducting layer or the regrown semiconductor material.

In some embodiments of the present invention, the strained Si layer is formed within the opening atop a recessed regrown semiconductor material.

In other embodiments of the present invention, the strained Si layer overlies the second semiconductor layer and is formed atop the second semiconducting layer prior to forming the opening within the hybrid substrate.

In yet other embodiments of the present invention, the strained Si layer overlies both the regrown semiconductor material and the second semiconducting layer. In those embodiments, a first strained Si layer is formed atop the second semiconducting layer prior to forming the opening within the hybrid substrate, and a second strained Si layer is formed atop a recessed regrown semiconductor material within said opening.

In still yet other embodiments of the present invention, the strained Si layer is formed atop a relaxed SiGe alloy layer that has been formed via a thermal mixing process.

The present invention also provides a Si-containing hybrid substrate comprising:

a hybrid substrate comprising a first semiconducting layer of a first crystallographic orientation, a buried insulating layer located on a surface of the first semiconductor layer and a second semiconducting layer of a second crystallographic orientation which is different from the first crystallographic orientation located on said buried insulating layer;

a regrown semiconductor material located on a surface portion of the first semiconducting layer; and a strained Si layer overlying at least one of the regrown semiconductor layer or the second semiconductor layer, wherein said strained Si layer has a crystallographic orientation that matches the crystallographic orientation of the underlying regrown semiconductor material or the second semiconducting layer.

In some embodiments, the strained Si layer overlies the regrown semiconductor material only. In other embodiments, the strained Si layer overlies the second semiconducting layer only. In yet other embodiments, strained Si layers overlay both the regrown semiconductor material and the second semiconductor layer.

DETAILED DESCRIPTION OF THE INVENTION

Figure 1A:
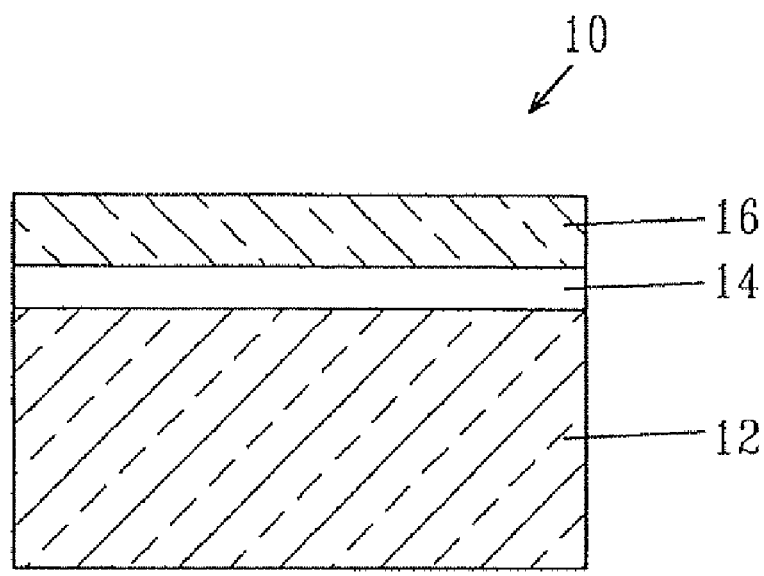
FIGS. 1A-1D are pictorial representations (through cross sectional views) showing processing steps of a first embodiment of the present invention.

The present invention, which provides methods of fabricating CMOS devices on a strained Si-containing hybrid substrate having first and second semiconducting layers of different crystal orientations, will now be described in greater detail by referring to the drawings that accompany the present application. The drawings that accompany the present application illustrate the strained Si-containing hybrid substrate only. Illustration of semiconductor devices, and trench isolation regions within each of the drawings has been omitted for clarity. Despite this omission, the strained Si-containing hybrid substrates shown in the drawings can contain semiconductor devices, i.e., CMOS transistors, atop the uppermost layers of the substrate and trench isolation regions can be formed therein as well.

In the drawings, the final hybrid substrate has upper coplanar regions of different crystallographic orientation. The coplanar regions could be for example, a second semiconducting layer and a strained Si layer; strained Si layer and a regrown semiconductor material; or a first strained Si layer and a second strained Si layer. As stated above, each upper region has a crystallographic orientation that differs from the other.

Figure 1B:
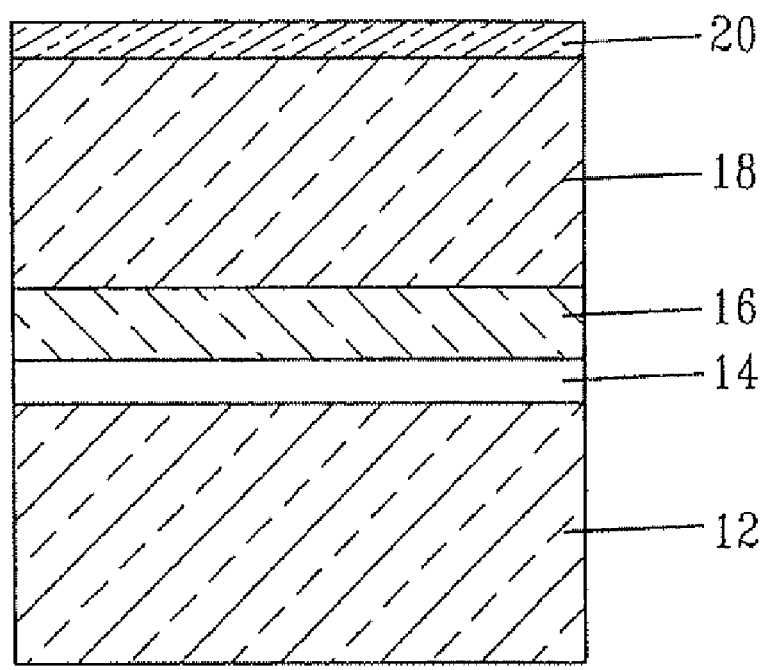
Figure 1C:
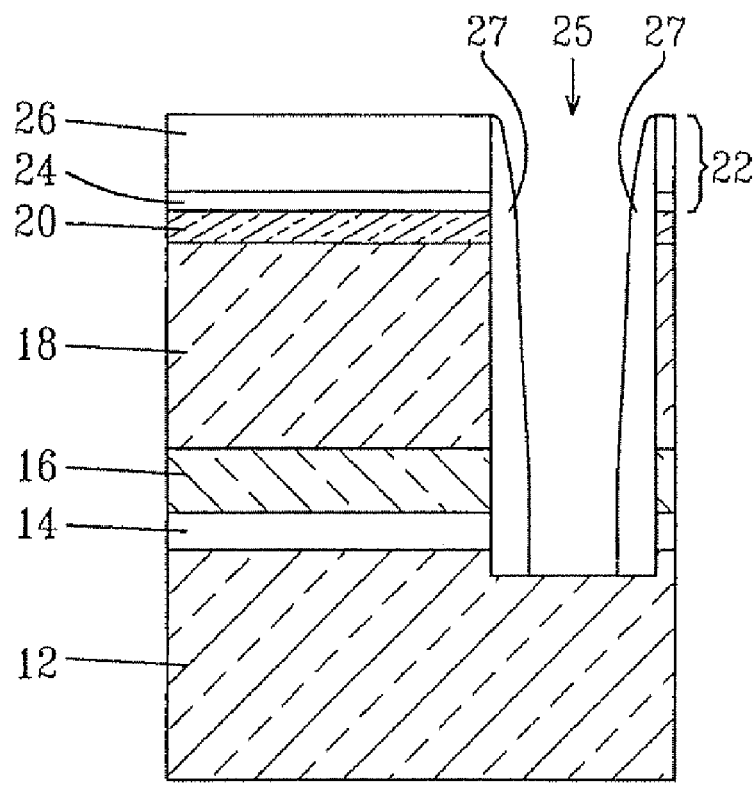
Figure 1D:
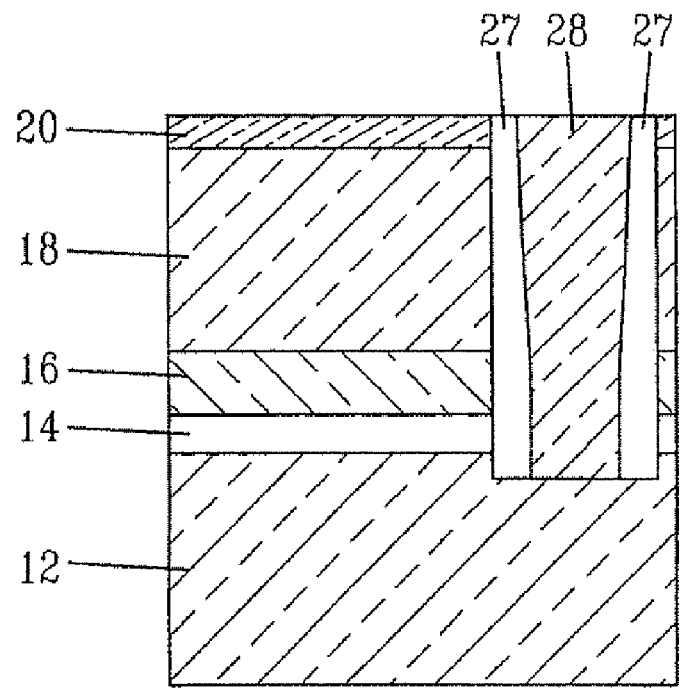

Reference is first made to FIGS. 1A-1D which illustrate a first embodiment of the present invention. In this first embodiment (See FIG. 1D), a strained Si layer 20 is located on a relaxed SiGe layer 18 that is formed atop a surface of the second semiconducting layer 16 of hybrid substrate 10. In the embodiment, the device that would be formed atop the strained Si layer 20 would be SOI like since a buried insulating layer 14 is located there beneath. A regrown semiconductor layer 28 is formed after formation of the relaxed SiGe layer 18 and the strained Si layer 20 by patterning, etching and regrowth. Regrowth occurs on the first semiconductor layer 12 of the hybrid substrate 10 thus the regrown semiconductor layer 28 has the same crystal orientation as the first semiconductor layer 12 of the hybrid substrate 10, while the strained Si layer 20 and the relaxed SiGe layer 18 have the same crystal orientation as the second semiconductor layer 16 of the hybrid substrate 10. As shown in FIG. 1D, isolation is present in the structure in the form of optional spacers 27.

Referring to FIG. 1A, there is shown the hybrid substrate 10 that is employed in the first embodiment of the present invention. The hybrid substrate 10 comprises a first semiconducting layer 12, a buried insulating layer 14 located on a surface of the first semiconducting layer 12, and a second semiconducting layer 14 located on a surface of the buried insulating layer 14. In accordance with the present invention, the first semiconducting layer 12 of the hybrid substrate 10 comprises a first semiconducting material that has a first crystallographic orientation and the second semiconducting layer 16 of the hybrid substrate 10 comprises a second semiconducting material that has a second crystallographic orientation which differs from the first crystallographic orientation.

The first semiconducting layer 12 of the hybrid substrate 10 is comprised of any semiconducting material including, for example, Si, SiC, SiGe, SiGeC, Ge, GaAs, InAs, InP as well as other III/V or II/VI compound semiconductors. Combinations of the aforementioned semiconductor materials are also contemplated herein. The first semiconducting layer 12 may be unstrained, strained or a combination of strained and unstrained layers. The first semiconducting layer 12 is also characterized as having a first crystallographic orientation which may be (110), (111), or (100). The first semiconducting layer 12 may optionally be formed on top of a handling wafer.

In some instances, the first semiconducting layer 12 is a bulk handle wafer, and its thickness is the thickness of a wafer.

The second semiconducting layer 16 is comprised of any semiconducting material which may be the same or different from that of the first semiconducting layer 12. Thus, the second semiconducting layer 16 may include, for example, Si, SiC, SiGe, SiGeC, Ge, GaAs, InAs, InP as well as other III/V or II/VI compound semiconductors. The second semiconducting layer 16 may be unstrained, strained or a combination of strained and unstrained layers. The second semiconducting layer 16 may also include combinations of the aforementioned semiconducting materials.

The second semiconducting layer 16 is also characterized as having a second crystallographic orientation, which is different from the first crystallographic orientation. Thus, the crystallographic orientation of the second semiconducting layer 16 is (100), (111), or (110) with the proviso that the crystallographic orientation of the second semiconducting layer 16 is not the same as the crystallographic orientation of the first semiconducting layer 12.

The thickness of the second semiconducting layer 16 may vary depending on the initial starting wafer used to form the hybrid substrate 10. Typically, however, the second semiconducting layer 16 has a thickness from about 10 nm to about 200 µm, with a thickness from about 50 nm to about 2 µm being more typical.

The buried insulating layer 14 that is located between the first and second semiconducting layers (12 and 16) of the hybrid substrate 10 can be an oxide, nitride, oxynitride or any combination of these insulating materials. In some embodiments, the buried insulating layer 14 is an oxide.

The hybrid substrate 10 shown in FIG. 1A is formed utilizing a layer transfer process in which bonding is employed.

In some embodiments of the present invention, the hybrid substrate 10 is an SOI substrate having a thick BOX region, i.e., buried oxide. In such an embodiment, the SOI thickness is from about 5 to 100 nm. In yet another embodiment of the present invention, the hybrid substrate 10 contains a thin BOX that is formed by semiconductor-to-semiconductor, especially Si-to-Si, direct wafer bonding. In this embodiment, the top SOI layer has a thickness from about 200 nm to about 2 µm, while the BOX has a thickness of less than about 10 nm. In still yet another embodiment of the present invention, the hybrid substrate 10 contains a thick BOX formed beneath a thick SOI layer. In that embodiment, the SOI layer has a thickness from about 200 nm to about 2 µm, while the BOX has a thickness of about 10 nm or greater. In this embodiment, the hybrid substrate is formed by bonding at least one semiconductor wafer having an insulator to another semiconductor wafer, which may or may not have an insulating layer.

The semiconducting layers (12 and 16) used in fabricating the hybrid substrate 10 may include two SOI wafers wherein one of the wafers includes the first semiconducting layer 12 and the other wafer includes the second semiconducting layer 16; an SOI wafer and a bulk semiconductor wafer; two bulk semiconductor wafers which both contain an insulating layer thereon; or an SOI wafer and a bulk wafer which includes an ion implant region, such as a $H_2$ implant region, which can be used to split a portion of at least one of the wafers during bonding.

Bonding is achieved by first bringing the two semiconducting wafers into intimate contact with other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature from about 200° to about 1050° C. for a time period from about 2 to about 20 hours. More preferably, the bonding is performed at a temperature from about 200° to about 400° C. for a time period from about 2 to about 20 hours. The term "inert ambient" is used in the present invention to denote an atmosphere in which an inert gas, such as He, Ar, $N_2$, Xe, Kr or a mixture thereof, is employed. A preferred ambient used during the bonding process is $N_2$.

In the embodiment in which direct semiconductor-to-semiconductor wafer bonding is employed, bonding is achieved at nominal room temperature (15° C.-40° C.). The surfaces of the two wafers used in this direct bonding technique may be subjected to a surface treatment step in which at least one, but preferably both, of the surfaces for direct bonding are converted into a hydrophilic or hydrophobic surface.

Hydrophobic surfaces can be achieved, for example, by utilizing a HF dip process such as disclosed in S. Bengtsson, et al., "Interface charge control of directly bonded silicon structures", J. Appl. Phys. V66, p 1231, (1989), while hydrophilic surfaces can be achieved by either a dry clean process, such as, for example, an oxygen plasma (See, S. Farrens, "Chemical free room temperature wafer to wafer bonding", J. Electrochem. Soc. Vol 142, p 3949, (1995)); an argon high-energy beam surface etching, and/or a wet chemical oxidizing acid such as $H_2SO_4$ or $HNO_3$ solution. The wet etching process is disclosed, for example, in M. Shimbo, etc. "Silicon-to-silicon direct bonding method", J. Appl. Phys. V60, p 2987 (1986).

In some embodiments, an additional annealing step is performed after the bonding to further increase the bond strength of the bonded wafers. When the additional annealing step is employed, the annealing occurs in an inert ambient at a temperature from 100° to about 400° C. for a time period from about 2 to about 30 hours. More preferably, and when increased bonding energy is required, the annealing step that occurs after bonding is performed at a temperature from about 200° to about 300° C. for a time period from about 2 to about 20 hours. When an $H_2$ implant is present, layer splitting occurs after bonding at the implant region during a 350° C.-500° C. anneal.

In the embodiment where two SOI wafers are employed, some material layers of at least one of the SOI wafers may be removed after bonding utilizing a planarization process such as chemical mechanical polishing (CMP) or grinding and etching.

In the embodiment in which one of the wafers includes an ion implant region, the ion implant region forms a porous region during bonding which causes a portion of the wafer above the ion implant region to break off leaving a bonded wafer. The implant region is typically comprised of $H_2$ ions that are implanted into the surface of the wafer utilizing ion implantation conditions that are well known to those skilled in the art.

After providing the hybrid substrate 10 shown in FIG. 1A, a relaxed SiGe alloy layer 18 is formed on a surface of the second semiconducting layer 16 of the hybrid substrate 10 by utilizing a conventional epitaxial growth process. The structure including the relaxed SiGe alloy layer 18 is shown, for example, in FIG. 1B. The thickness of the relaxed SiGe alloy layer 18 may vary provided that the SiGe alloy layer 18 that is grown is in a relaxed state. Typically, the relaxed SiGe alloy layer 18 has a thickness from about 10 to about 2000 nm, with a thickness from about 50 to about 1000 nm being more typical.

Since the relaxed SiGe alloy layer 18 is epitaxially grown on a surface of the second semiconducting layer 16, the relaxed SiGe alloy layer 18 will have the same crystallographic orientation as the second semiconducting layer 16.

After forming the relaxed SiGe alloy layer 18 atop the hybrid substrate 10, a strained Si layer 20 is formed atop the relaxed SiGe alloy layer 18. The structure including the strained Si layer 20 is also shown in FIG. 1B. The strained Si layer 20 is formed atop the relaxed SiGe alloy layer 18 utilizing an epitaxial growth method.

The strained Si layer 20 has a thickness that is generally less than the thickness of the underlying relaxed SiGe alloy layer 18. Typically, the thickness of the strained Si layer 20 is from about 5 to about 50 nm, with a thickness from about 10 to about 20 nm being more typical. The level of strain in the strained Si layer 20 is a function of the Ge mole fraction of the SiGe alloy layer 18. A 20% of Ge is typically used.

Since the strained Si layer 20 is formed on a surface of the relaxed SiGe alloy layer 18, the strained Si layer 20 will have the same crystal orientation as the relaxed SiGe alloy layer 18 (which crystallographic orientation is determined by the second semiconducting layer 16). Hence, in this embodiment of the present invention, strained Si layer 20 has the same crystallographic orientation as the second semiconducting layer 16.

A hard mask layer, i.e., pad stack, 22 is formed on an exposed upper surface of the strained Si layer 20 utilizing a deposition process such as, for example, chemical vapor deposition (CVD), plasma-enhanced chemical vapor deposition (PECVD), chemical solution deposition, atomic layer deposition, or physical vapor deposition. Alternatively, the hard mask layer 22 can be formed utilizing a thermal oxidation, nitridation or oxynitridation process.

The hard mask layer 22 is composed of a dielectric material such as, for example, an oxide, nitride, oxynitride or a stack thereof. In the embodiment shown in FIG. 1C, hard mask layer 22 comprises an oxide layer 24 and a nitride layer 26. The thickness of the hard mask layer 22 may vary depending on the composition of the mask material as well as the technique that was used in forming the same. Typically, the hard mask layer 22 has, an as deposited thickness, from about 5 to about 500 nm.

The hard mask layer 22 is then patterned by lithography and etching to provide a patterned mask that is used in the present invention as an etch mask to remove an exposed portion of the strained Si layer 20, an underlying portion of the relaxed SiGe alloy layer 18, an underlying portion of the second semiconducting layer 16, and an underlying portion of the buried insulating layer 14 of the hybrid substrate 10, stopping either on an upper surface of the first semiconducting layer 12 or within the first semiconducting layer 12. The structure after pattern transfer and formation of opening 25 is shown, for example, in FIG. 1C.

The etching of the hard mask layer 22 and pattern transfer may be performed utilizing a single etching process or multiple etching steps may be employed. The etching may include a dry etching process such as reactive-ion etching, ion beam etching, plasma etching or laser etching, a wet etching process wherein a chemical etchant is employed or any combination thereof. In one preferred embodiment of the present invention, reactive-ion etching (RIE) is used in this step of the present invention to selectively remove the various layers exposing the underlying first semiconducting layer 12.

Next, an optional spacer 27 can be formed in the opening 25 on the exposed sidewalls provided by the above processing steps. The optional spacer 27 is formed by deposition and etching. The optional spacer 27 can be comprised of an insulating material such as, for example, an oxide, nitride, oxynitride or any combination thereof The optional spacer 27 may be a single spacer, as shown, or it may comprise multiple spacers. FIG. 1C shows the presence of optional spacers 27 in the structure.

A regrown semiconductor material 28 is then formed on the exposed surface of the first semiconducting layer 12. In accordance with the present invention, semiconductor material 28 has a crystallographic orientation that is the same as the crystallographic orientation of the first semiconducting layer 12. Although this regrown semiconductor material 28 will have the same surface orientation as the first semiconducting layer 12, it can be of a different semiconductor material than the first semiconducting layer 12.

The regrown semiconductor material 28 may comprise any semiconductor material, such as Si, strained Si, SiGe, SiC, SiGeC or combinations thereof, which is capable of being formed utilizing a selective epitaxial growth method. The regrown material 28 can be strained or unstrained. In this embodiment, the regrown semiconductor material is an unstrained semiconductor material.

To achieve a high quality regrown semiconductor material 28, selective epitaxy is recommended where there is no polysilicon or amorphous silicon formed on top of the patterned mask outside the openings 25. To eliminate a facet formation during the epitaxy, the regrown semiconductor material 28 can be grown, in some embodiments, higher than the patterned mask and then it is polished down to the patterned mask.

After forming the regrown semiconductor material 28, the structure is subjected to a conventional planarization process such CMP to provide the strained Si-containing hybrid substrate shown in FIG. 1D. As shown, the planarization step removes the patterned hard mask from the structure providing a substantially planar strained Si-containing hybrid substrate 10 in which the strained Si layer 20 is substantially coplanar to the regrown semiconductor material 28. The hybrid substrate shown in FIG. 1D has regions of different crystal orientations, i.e., the strained Si layer 20 and the regrown semiconductor material 28, in which semiconductor devices can be formed.

Standard CMOS processing can be performed, including, for example, device isolation formation, well region formation, and gate region formation. Specifically, after providing the structure shown, in FIG. 1D, isolation regions, such as shallow trench isolation regions, are typically formed so as to isolate the device regions from each other.

The isolation regions are formed utilizing processing steps that are well known to those skilled in the art including, for example, trench definition and etching; optionally lining the trench with a diffusion barrier; and filling the trench with a trench dielectric such as an oxide. After the trench fill, the structure may be planarized and an optional densification process step may be performed to densify the trench dielectric.

Semiconductor devices, i.e., pFETs and nFETs, are formed on the exposed semiconductor layers, i.e., the strained Si layer 20 and regrown semiconductor material 28. In accordance with the present invention, the type of device formed is dependent on the crystallographic orientation of the underlying semiconductor layer, i.e., the crystallographic orientation of the strained Si layer 20 and the crystallographic orientation of the regrown semiconductor layer 28. The pFETs and nFETs are formed utilizing standard CMOS processing steps that are well known to those skilled in the art. Each FET includes a gate dielectric, a gate conductor, an optional hard mask located atop the gate conductor, spacers located on sidewalls of at least the gate conductor, and source/drain diffusion regions. Note that the pFET is formed over the semiconductor material that has a (110) or (111) orientation, whereas the nFET is formed over a semiconductor surface having a (100) or (111) orientation.

Figure 2A:
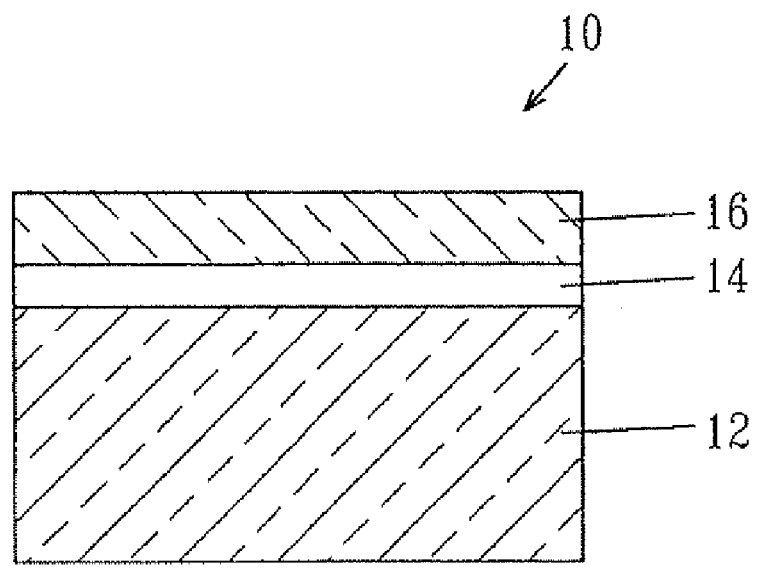
FIGS. 2A-2D are pictorial representations (through cross sectional views) showing processing steps of a second embodiment of the present invention.
Figure 2B:
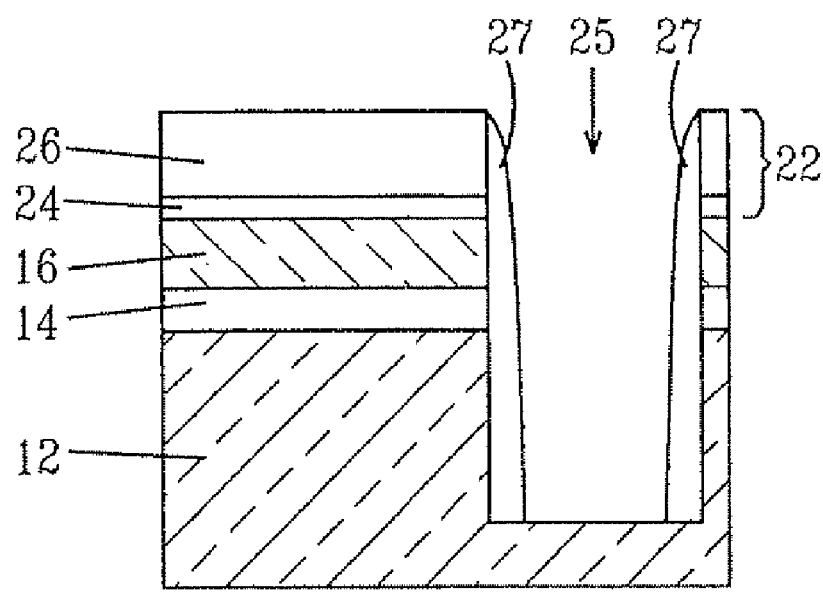
Figure 2C:
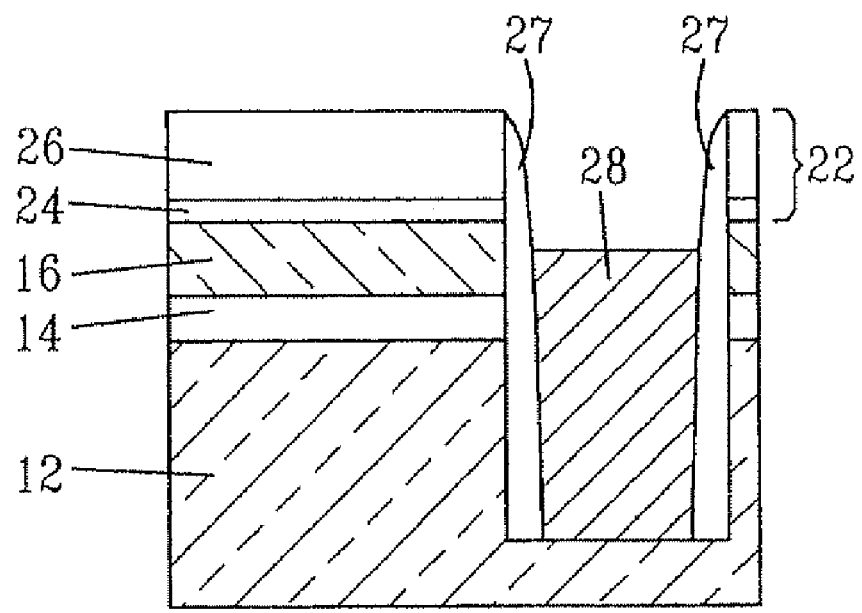
Figure 2D:
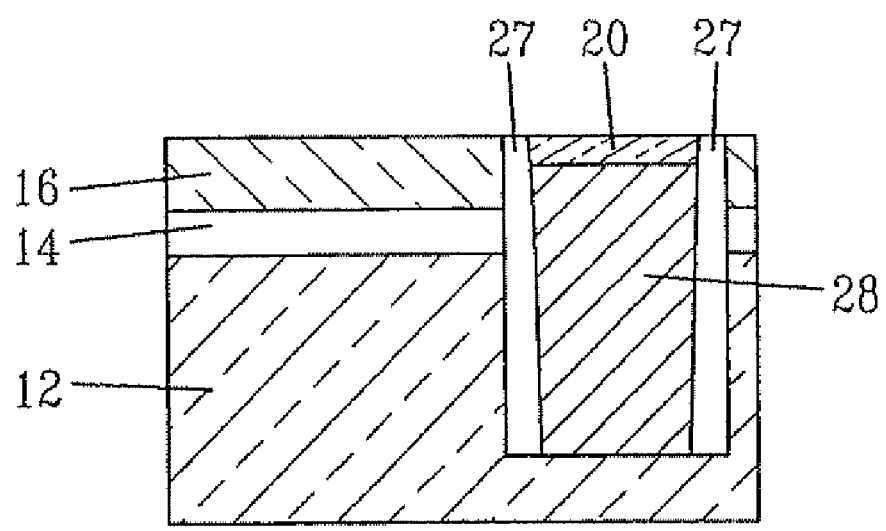

FIGS. 2A-2D show a second embodiment of the present invention. In this embodiment, as shown in FIG. 2D, the regrown semiconductor material 28 comprises a recessed relaxed SiGe alloy layer. A strained Si layer 20 is formed atop the recessed relaxed SiGe material 28. In the second embodiment, the strained Si layer 20 has the same crystallographic orientation as the regrown semiconductor material 28. Hence, since the regrown semiconductor material 28 is formed atop a portion of the first semiconducting layer 12 of a first crystallographic orientation, the recessed regrown semiconductor material 28 and the strained Si layer 20 have the first crystallographic orientation.

FIG. 2A shows a hybrid substrate 10 that includes a first semiconducting layer 12, a buried insulating layer 14 located on the first semiconducting layer 12 and second semiconducting layer 16 located in the buried insulating layer 14. The hybrid structure 10 shown in FIG. 2A is the same as that shown in FIG. 1A; therefore the above description concerning the various elements and processes used above apply equally here for this embodiment.

Next, the structure shown in FIG. 2B is provided by first forming a hard mask layer 22 comprising an oxide layer 24 and a nitride layer 26 atop a surface of the second semiconducting layer 16. An opening 25 is provided that exposes a surface of the underlying first semiconducting layer 12. The opening 25 is formed by first patterning the hard mask layer 22 by lithography and etching. Optional spacers 27 are then formed as described above.

A regrown semiconductor material 28 comprising a relaxed SiGe alloy layer is then formed by selective epitaxy on the exposed surface of the first semiconducting layer 12. The relaxed SiGe alloy layer (i.e., regrown semiconductor material 28) can be planarized to the top surface of the patterned hard mask layer 22 if needed, and then it is recessed by utilizing a timed RIE step to provide the structure shown, for example, in FIG. 2C. The depth of the recess may vary depending on the desired thickness of the strained Si layer 20 to be subsequently formed.

In this embodiment of the present invention, the relaxed SiGe alloy layer, i.e., regrown semiconductor material 28, which is formed by epitaxy has the same crystallographic orientation as that of the first semiconducting layer 12.

Next, a strained Si layer 20 is formed by a conventional deposition process such as CVD or epitaxy, atop the recessed surface of the regrown relaxed SiGe alloy layer 28. The patterned hard mask layer 22 is then removed from the structure via a planarization process providing the strained Si-containing hybrid substrate shown in FIG. 2D. In this embodiment, one of the device regions for forming CMOS devices is the exposed surface of the second semiconductor layer 16, while the other device region is the strained Si layer 20. In this embodiment, the strained Si layer 20 has the same crystallographic orientation as first semiconducting layer 12 since it is located atop an epitaxially regrown semiconductor material 28. Isolation regions and CMOS devices as described above can be formed on the structure shown in FIG. 2D.

Figure 3A:
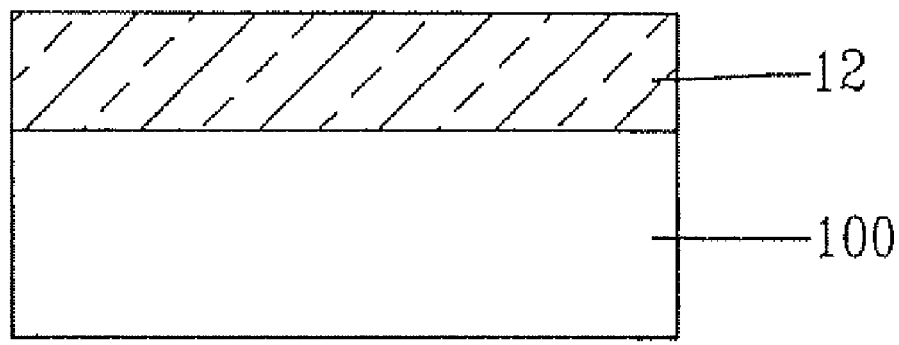
FIGS. 3A-3D are pictorial representations (through cross sectional views) showing processing steps of a third embodiment of the present invention.
Figure 3B:
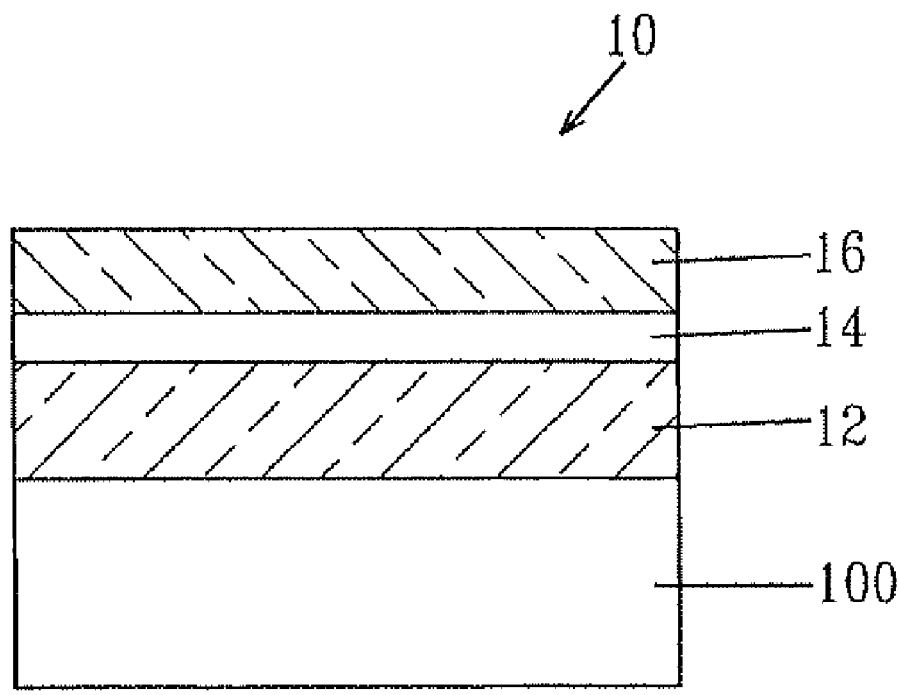

The third embodiment of the present invention is slightly different from the first two embodiments mentioned above in that the process flow begins with first providing the structure shown in FIG. 3A which includes a first semiconducting layer 12 in the form of a relaxed SiGe alloy layer formed directly on a surface of a handle wafer 100. The handle wafer comprises any semiconducting or non-semiconducting substrate and the first semiconducting layer 12 is formed by a deposition process.

Next, the structure shown in FIG. 3A is bonded to a structure that includes a buried insulating layer 14 and a second semiconducting layer 16 so as to provide the structure shown in FIG. 313.

Figure 3C:
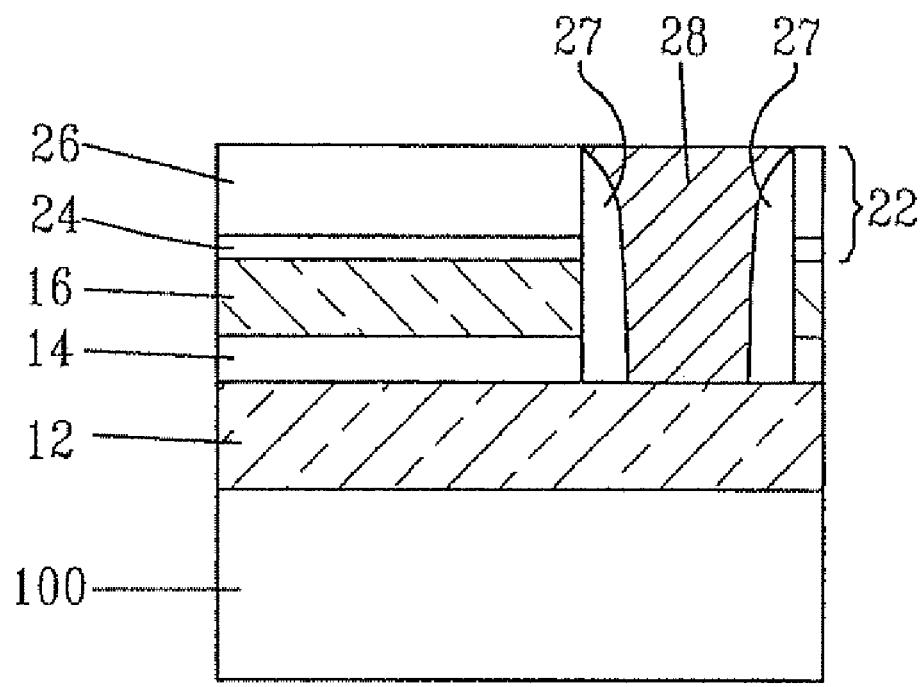

A patterned hard mask layer 22 comprising oxide layer 24 and nitride layer 26 is then formed as described above and thereafter an opening that extends down to the relaxed SiGe alloy layer, i.e., first semiconducting layer 12, is formed through the patterned hard mask layer 22. A regrown semiconducting material 28 comprising a relaxed SiGe alloy is then regrown on the exposed first semiconducting layer 12 which also comprises a relaxed SiGe alloy layer providing the structure shown, in FIG. 3C.

Figure 3D:
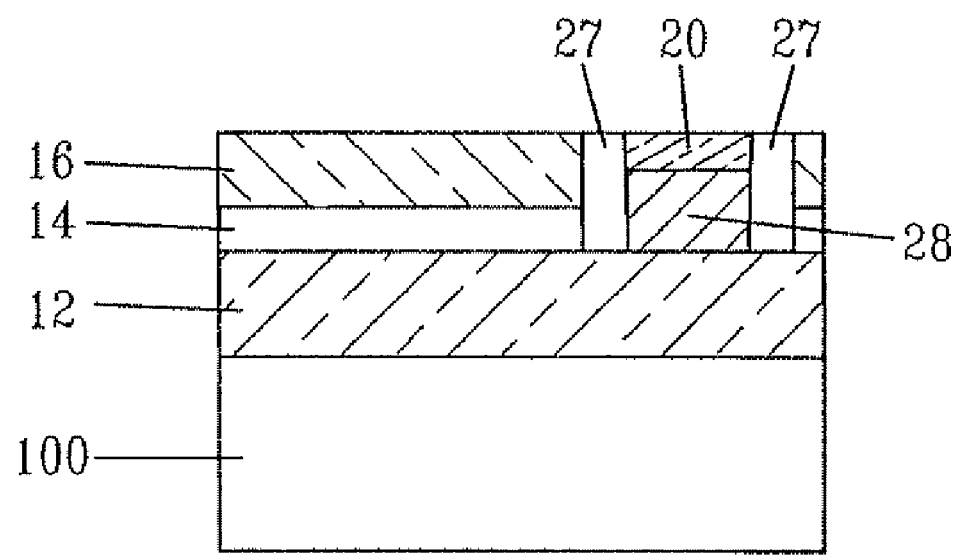

The regrown semiconductor material 28 comprising the relaxed SiGe alloy is then recessed as described above and a strained Si layer 20 is formed thereon. The structure is then planarized providing the strained Si-containing hybrid substrate shown in FIG. 3D.

FIGS. 4A-4E show a fourth embodiment of the present invention for forming a strained Si-containing hybrid substrate. The fourth embodiment of the present invention begins with providing the initial structure shown in FIG. 4A. The initial structure includes a first semiconducting layer 12, a buried insulating layer 14 and a sacrificial second semiconducting layer 16'.

Figure 4A:
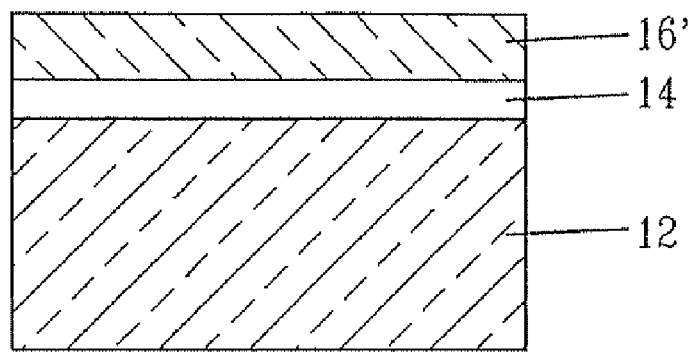
FIGS. 4A-4E are pictorial representations (through cross sectional views) showing processing steps of a fourth embodiment of the present invention.
Figure 4B:
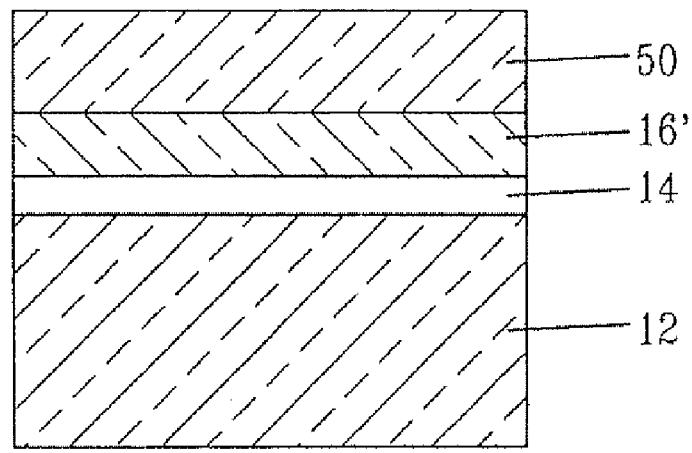

A SiGe alloy layer 50 that is thin (having a thickness of about 100 nm or less) is then formed atop the sacrificial second semiconducting layer 16' providing the structure shown in FIG. 4B. The SiGe alloy layer 50 can be formed utilizing any conventional deposition process such as CVD or epitaxial growth.

The structure shown in FIG. 4B is then subjected to a thermal mixing step. Specifically, the thermal mixing step is an annealing step that is performed at a temperature which permits interdiffusion of Ge throughout the sacrificial second semiconductor layer 16' and the SiGe alloy layer 50 forming a relaxed SiGe alloy layer as the second semiconducting layer 16 (See FIG. 4C). Note that an oxide layer (not shown) is formed atop layer 16 during the annealing step. This oxide layer is typically removed from the structure after the annealing step using a conventional wet etch process wherein a chemical etchant such as HF that has a high selectivity for removing oxide as compared to SiGe is employed.

Specifically, the annealing step of the present invention is performed at a temperature from about 900° to about 1350° C., with a temperature from about 1200° to about 1335° C. being more highly preferred. Moreover, the annealing step of the present invention is carried out in an oxidizing ambient which includes at least one oxygen-containing gas such as $O_2$, NO, N$_2$O, ozone, air and other like oxygen-containing gases. The oxygen-containing gas may be admixed with each other (such as an admixture of O$_2$ and NO), or the gas may be diluted with an inert gas such as He, Ar, N$_2$, Xe, Kr, or Ne.

The annealing step may be carried out for a variable period of time which typically ranges from about 10 to about 1800 minutes, with a time period from about 60 to about 600 minutes being more highly preferred. The annealing step may be carried out at a single targeted temperature, or various ramp and soak cycles using various ramp rates and soak times can be employed.

The annealing step is performed under an oxidizing ambient to achieve the presence of a surface oxide layer which acts as a diffusion barrier to Ge atoms. Therefore, once the oxide layer is formed on the surface of the structure, Ge becomes trapped between buried insulating layer 14 and the surface oxide layer. As the surface oxide increases in thickness, the Ge becomes more uniformly distributed throughout layers 16' and 50 but it is continually and efficiently rejected from the encroaching oxide layer. Efficient thermal mixing is achieved in the present invention when the heating step is carried out at a temperature from about 1200° to about 1320° C. in a diluted oxygen-containing gas.

It is also contemplated herein to use a tailored heat cycle which is based upon the melting point of the SiGe layer. In such an instance, the temperature is adjusted to tract below the melting point of the SiGe layer.

Following the annealing step which forms the second semiconducting layer 16 that is comprised of a relaxed SiGe alloy by thermal mixing SiGe alloy layer 50 and the sacrificial second semiconductor layer 16', a strained Si layer 20 is formed atop the second semiconducting layer 16 (i.e., the thermally mixed SiGe alloy layer). This structure is shown, for example, in FIG. 4C. The strained Si layer 20 is a thin layer having a thickness of about 20 nm or less and it is formed by conventional deposition processes well known in the art. The strained Si layer has the same crystallographic orientation as the semiconducting layer 16 that is formed via thermal mixing.

Figure 4C:
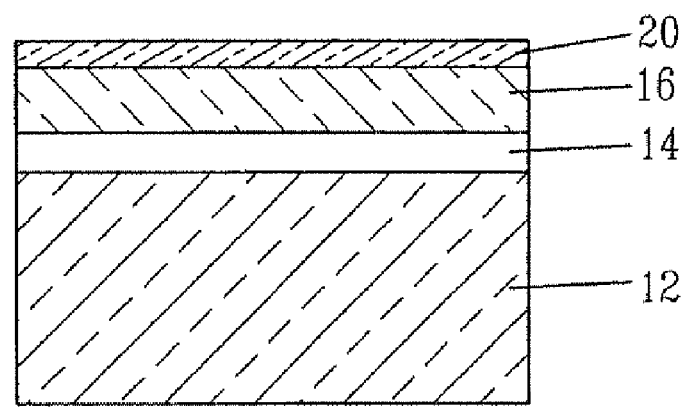
Figure 4D:
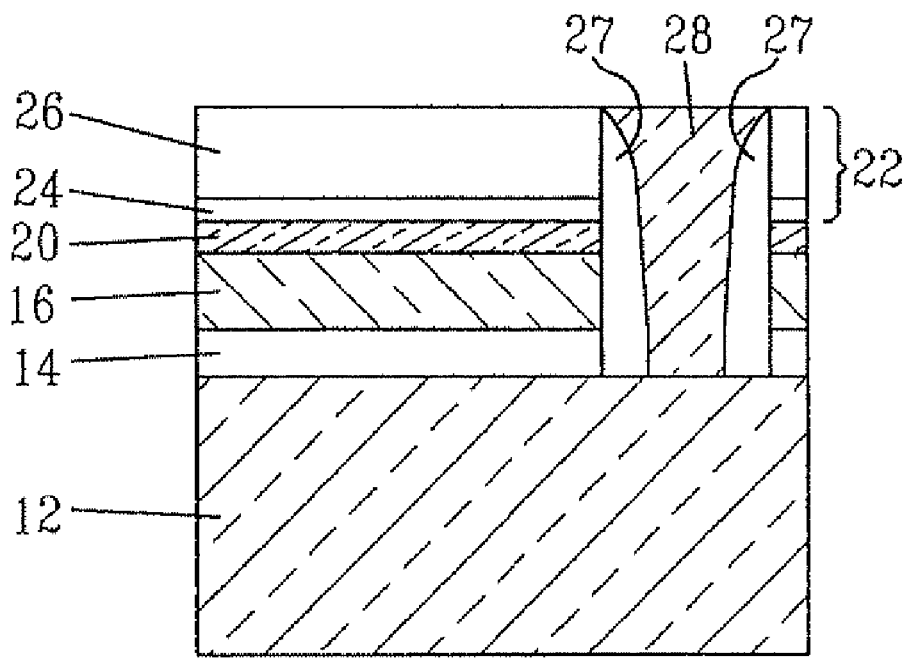

Next, the procedures used in forming the structure shown in FIG. 1C above are employed on the structure shown in FIG. 4C providing the structure shown in FIG. 4D. Specifically, a patterned hard mask layer 22 comprising oxide layer 24 and nitride layer 26 is first formed by deposition and lithography, opening 25 is then formed by etching down to the first semiconducting layer 12, optional spacers 27 are then formed by deposition and etching and regrown semiconductor material 28 that has the same crystallographic orientation as the first semiconducting layer 12 is formed within the opening.

Figure 4E:
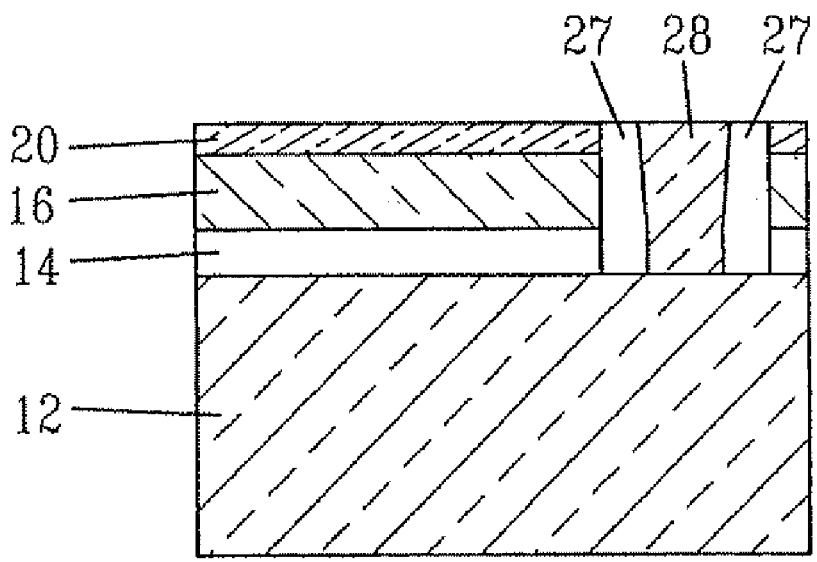

The strained Si-containing hybrid substrate shown in FIG. 4E is obtained using the processing steps described above in obtaining the structure shown in FIG. 1D which includes removal of the hard mask layer 22 and planarization.

Figure 5A:
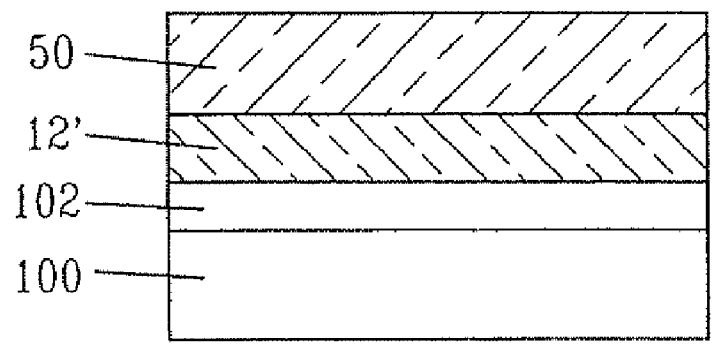
FIGS. 5A-5E are pictorial representations (through cross sectional views) showing processing steps of a fifth embodiment of the present invention.

The fifth embodiment of the present invention is shown in FIGS. 5A-E. Unlike the previous embodiments described above, the final strained Si-containing hybrid substrate shown in FIG. 5E has device regions that are both SOI like since buried insulating layers are present beneath the regrown semiconductor material 28 and the second semiconductor layer 16. FIG. 5A shows the initial structure of this embodiment of the present invention. Specifically, the initial structure shown in FIG. 5A includes a handle wafer 100, bottom insulating layer 102, first sacrificial semiconducting layer 12' and SiGe alloy layer 50. The handle wafer 100 may include any semiconductor or non-semiconductor substrate well known in the art. Bottom insulating layer 102 is comprised of one of the insulators mentioned above in regard to buried insulating layer 14. The SiGe alloy layer 50 is formed as described above and that layer typically has a thickness of about 100 nm or less.

Figure 5B:
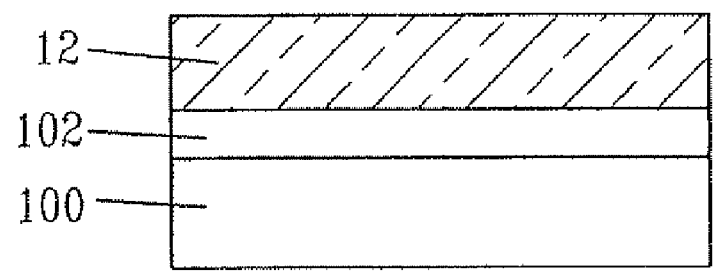

After providing the structure shown in FIG. 5A, the structure is subjected to the above described thermal mixing step providing the structure shown in FIG. 5B. In this embodiment, the thermal mixing step converts the sacrificial first semiconducting layer 12' and the SiGe alloy layer 50 into a first semiconductor layer 12 that comprises a thermally mixed and relaxed SiGe alloy. As shown, the structure includes handle wafer 100, bottom insulating layer 102 and thermally mixed first semiconducting layer 12.

The structure shown in FIG. 5B is then bonded to another structure that includes a buried insulating layer 14 and a second semiconducting layer 16 using the bonding process mentioned above. The resultant bonded structure is shown, for example, in FIG. 5C.

Figure 5C:
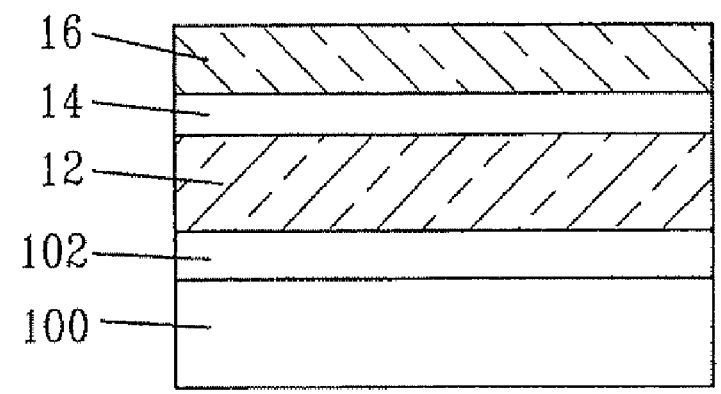
Figure 5D:
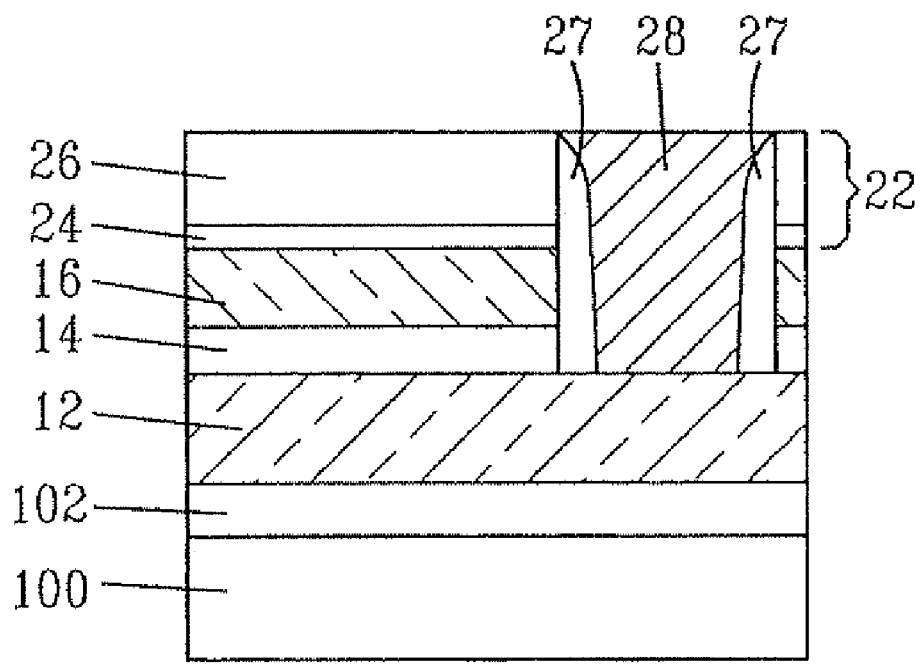

A hard mask layer 22 comprising an oxide layer 24 and a nitride layer 26 is then applied to a surface of the second semiconducting layer 16 shown in FIG. 5C and thereafter the hard mask layer 22 is patterned by lithography and etching. After patterning the hard mask layer 22, an opening that extends to a surface of the first semiconducting layer 12 is formed by etching. Optional spacers 27 are then formed in the opening and regrown semiconductor material 28 comprising a SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 5D. In this embodiment of the present invention, the regrown semiconductor material 28 has a crystallographic orientation that is the same as the first semiconducting layer 12.

Figure 5E:
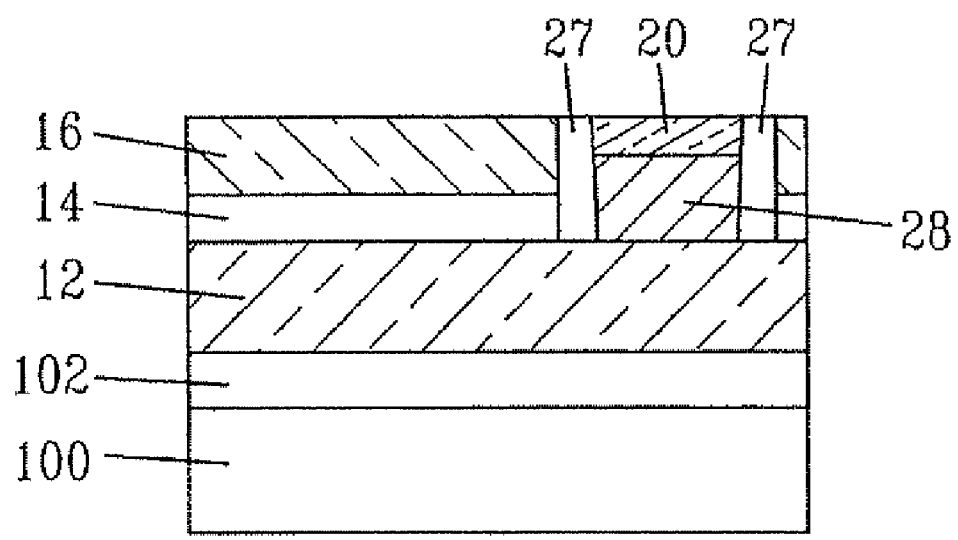

FIG. 5E shows the structure that is formed after the regrown semiconductor material 28 has been recessed, deposition of a strained Si layer 20 on the recessed regrown semiconductor material 28 and removal of the patterned hard mask layer 22 including the nitride layer 26 and the oxide layer 24.

Reference is now made to FIGS. 6A-6D which illustrate a sixth embodiment of the present invention. In the sixth embodiment of the present invention, all the device areas of the hybrid substrate include strained Si that has different crystallographic orientations.

Figure 6A:
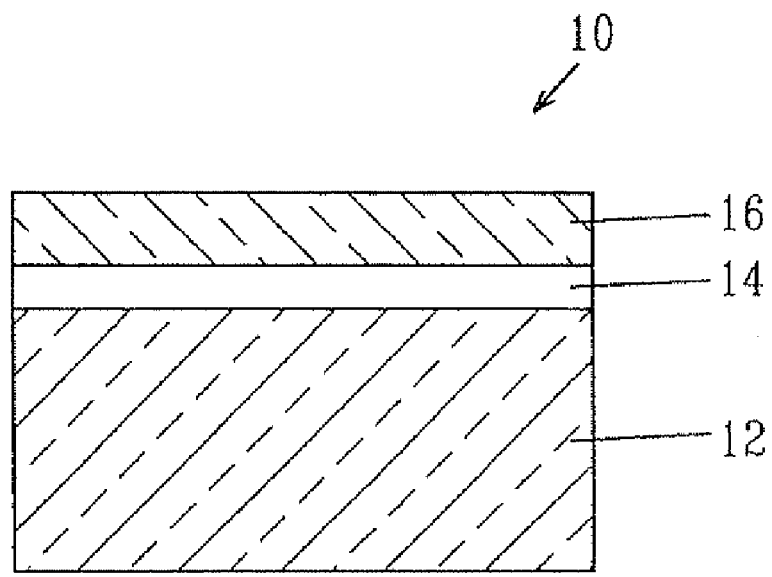
FIGS. 6A-6D are pictorial representations (through cross sectional views) showing processing steps of a sixth embodiment of the present invention.

FIG. 6A shows the initial hybrid substrate 10 that is employed in the present invention. As shown, the hybrid substrate 10 includes a first semiconducting layer 12, a buried insulating layer 14 located on the first semiconducting layer 12, and a second semiconducting layer 16 located on the buried insulating layer 14. The elements of the hybrid substrate 10 shown in FIG. 6A have been described above as well as the processes that are used in forming the same.

A relaxed SiGe alloy layer 18 is then formed on a surface of the second semiconducting layer 16 by an epitaxial growth method and thereafter a first strained Si layer 20 is formed atop the relaxed SiGe layer 18. The structure including the relaxed SiGe alloy layer 18 and the first strained Si layer 20 is shown, for example, in FIG. 6B.

Figure 6B:
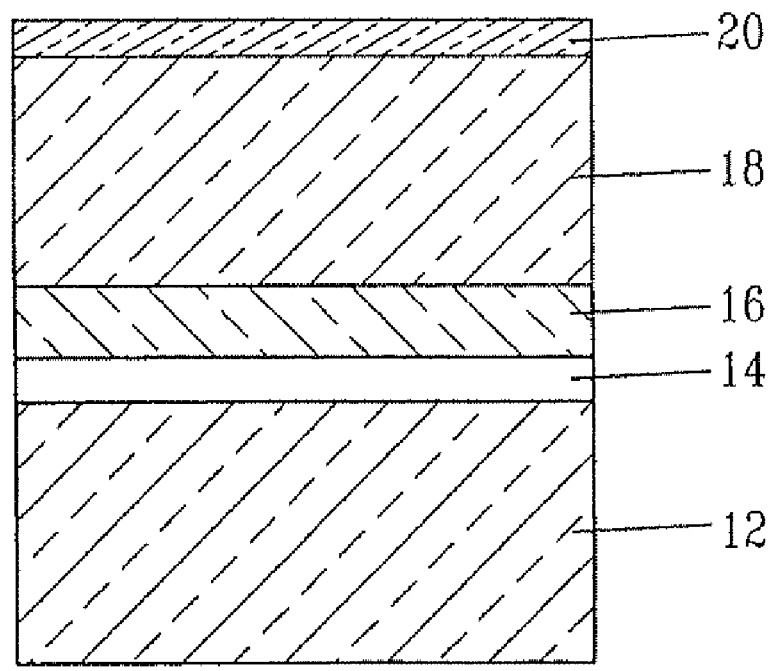
Figure 6C:
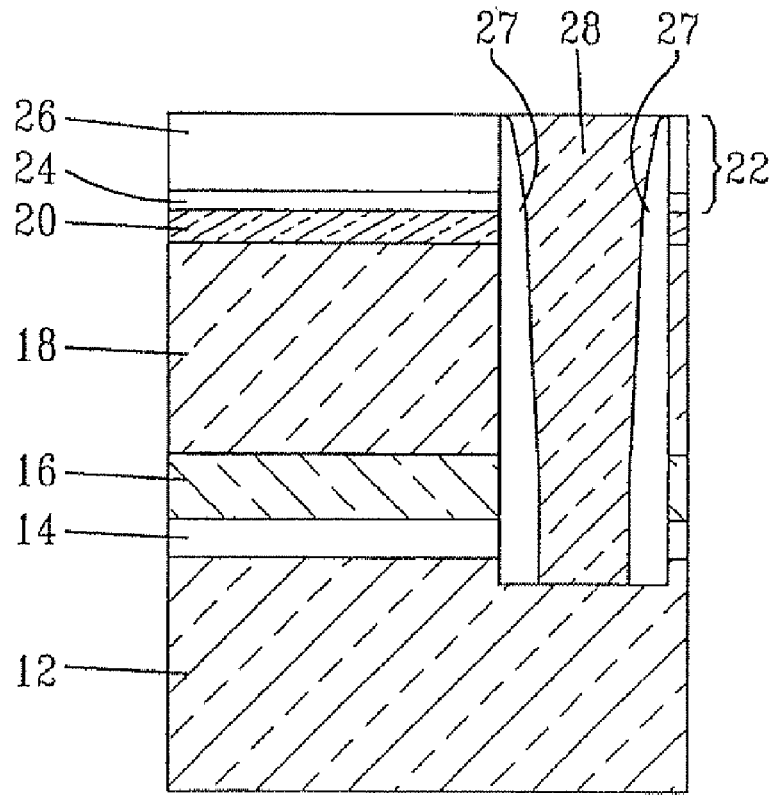

After providing the structure shown in FIG. 6B, a hard mask layer 22 comprising oxide layer 24 and nitride layer 26 is applied to a surface of the first strained Si layer 20 shown in FIG. 6B and thereafter the hard mask layer 22 is patterned by lithography and etching. After patterning the hard mask layer 22, an opening that extends to a surface of the first semiconducting layer 12 is formed by etching. Optional spacers 27 are then formed in the opening and regrown semiconductor material 28 comprising a relaxed SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 6C. In this embodiment of the present invention, the regrown semiconductor material 28 has a crystallographic orientation that is the same as the first semiconducting layer 12

Figure 6D:
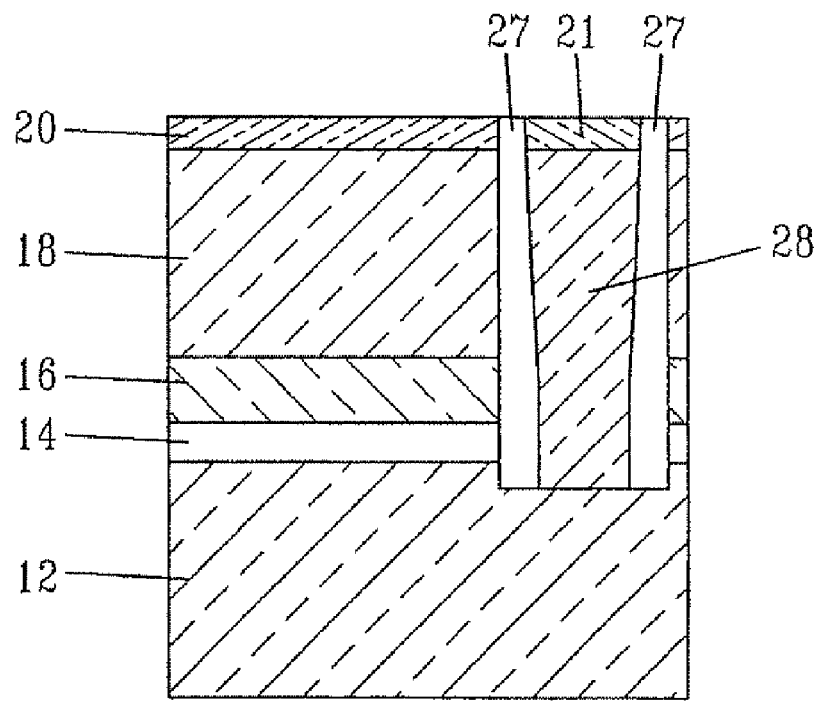

FIG. 6D shows the structure that is formed after the regrown semiconductor material 28 has been recessed, deposition of a second strained Si layer 21 on the recessed semiconductor material 28 and removal of the patterned hard mask layer 22 including the nitride layer 26 and the oxide layer 24. In the strained Si-containing hybrid substrate shown in FIG. 6D, the CMOS devices are formed on strained Si layers 20 and 21 that have different crystallographic orientations.

The seventh of the present invention will now be described in greater detail by referring to FIGS. 7A-7D. The seventh embodiment of the present invention begins with providing the structure shown in FIG. 7A. The structure shown in FIG. 7A comprising a handle wafer 100, and a relaxed SiGe layer as the first semiconducting material 12 formed atop the handle wafer 100. The relaxed SiGe layer is formed via an epitaxial growth process that is well known to those skilled in the art.

Figure 7A:
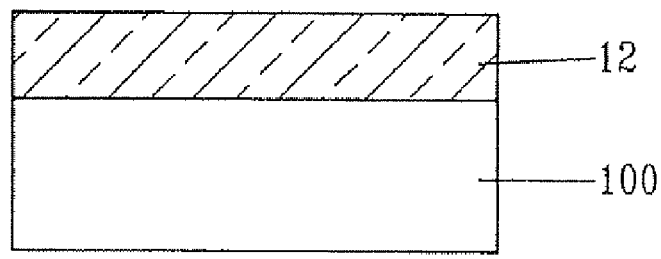
FIGS. 7A-7D are pictorial representations (through cross sectional views) showing processing steps of a seventh embodiment of the present invention.
Figure 7B:
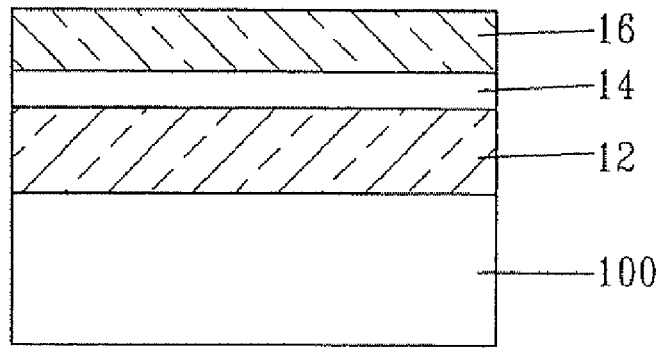
Figure 7C:
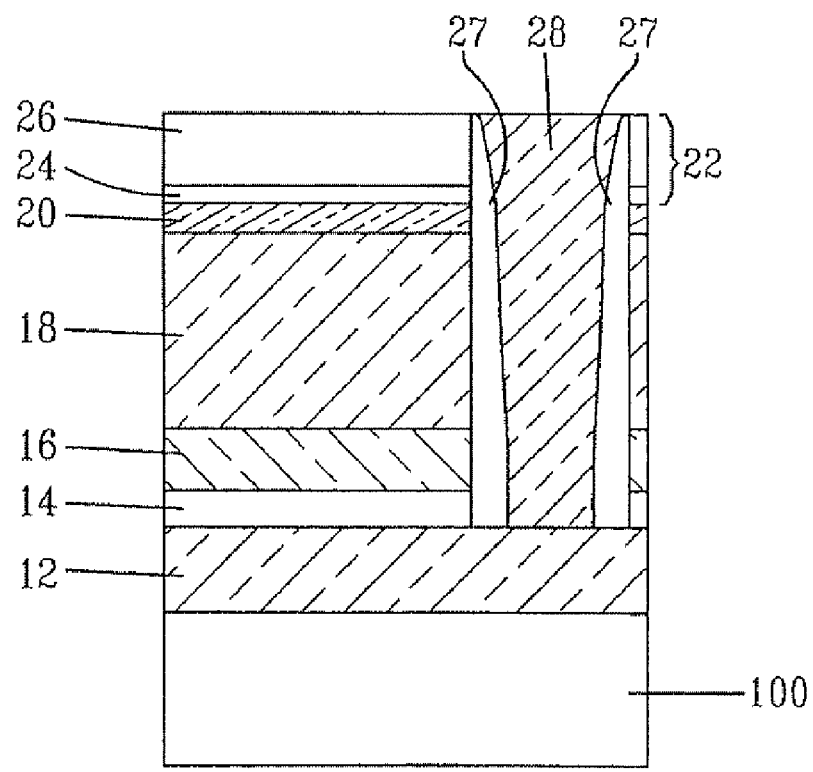

The structure shown in FIG. 7A is then bonded to another structure that includes a buried insulating layer 14 and a second semiconducting layer 16. The bonding is performed utilizing the bonding mentioned above. The structure that is formed after the bonding step is shown, for example, in FIG. 7B.

Next, a relaxed SiGe alloy layer 18 is formed via epitaxy on an exposed surface of the second semiconducting layer 16 and then a first strained Si layer 20 is formed atop the relaxed SiGe alloy layer 18. A hard mask layer 22 comprising oxide layer 24 and nitride layer 26 is applied to a surface of the first strained Si layer 20 and thereafter the hard mask layer 22 is patterned by lithography and etching. After patterning the hard mask layer 22, an opening that extends to a surface of the first semiconducting layer 12, i.e., relaxed SiGe layer, is formed by etching. Optional spacers 27 are then formed in the opening and regrown semiconductor material 28 comprising a relaxed SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 7C. In this embodiment of the present invention, the regrown SiGe alloy 28 has a crystallographic orientation that is the same as the first semiconducting layer 12.

Figure 7D:
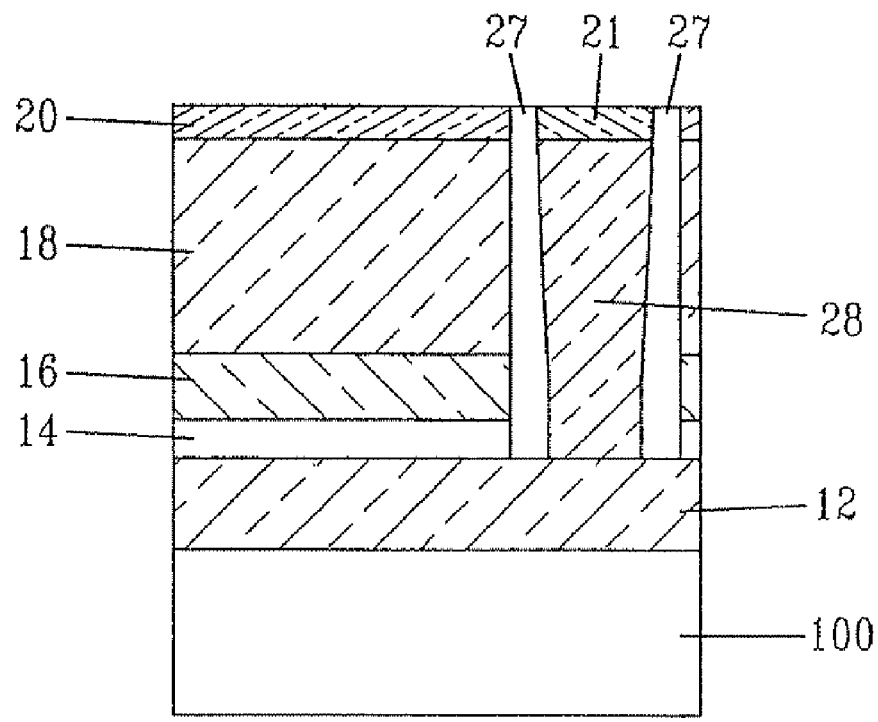

FIG. 7D shows the structure that is formed after the regrown relaxed SiGe alloy layer 28 has been recessed, deposition of a second strained Si layer 21 on the recessed regrown semiconductor material 28 and removal of the patterned hard mask layer 22 including the nitride layer 26 and the oxide layer 24. In the strained Si-containing hybrid substrate shown in FIG. 7D, the CMOS devices are formed on strained Si layers that have different crystallographic orientations.

FIGS. 8A-8E show an eighth embodiment of the present invention. In this embodiment, the structure shown in FIG. 5A is first provided. The structure shown in FIG. 8A includes handle wafer 100, bottom insulating layer 102, first sacrificial semiconducting layer 12', and SiGe alloy layer 50. The SiGe alloy layer 50 is grown on the surface of the first sacrificial semiconducting layer 12' epitaxially.

Figure 8A:
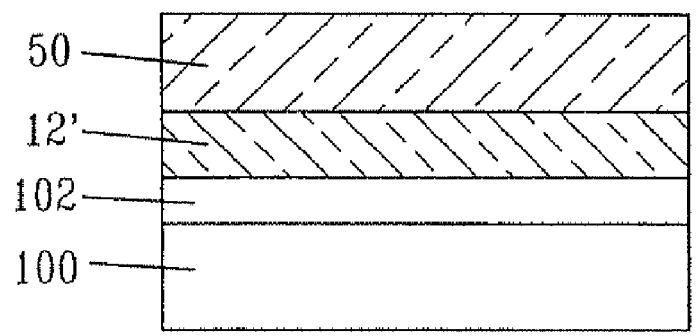
FIGS. 8A-8E are pictorial representations (through cross sectional views) showing processing steps of an eighth embodiment of the present invention.
Figure 8B:
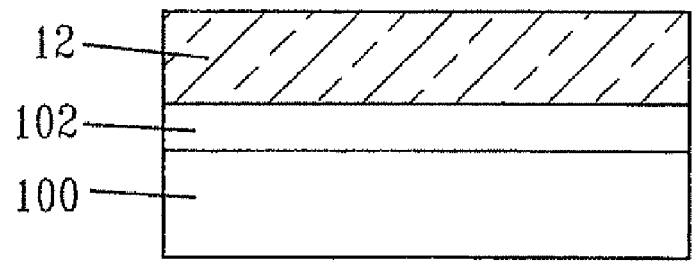
Figure 8C:
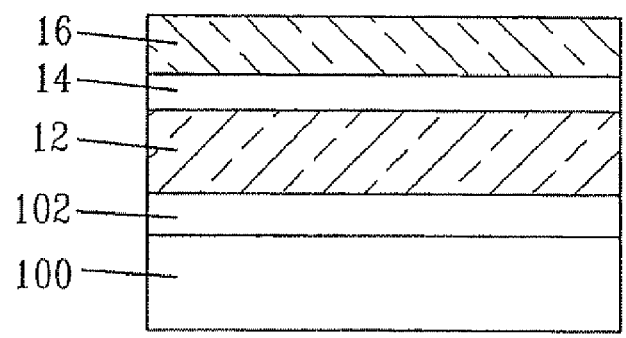
Figure 8D:
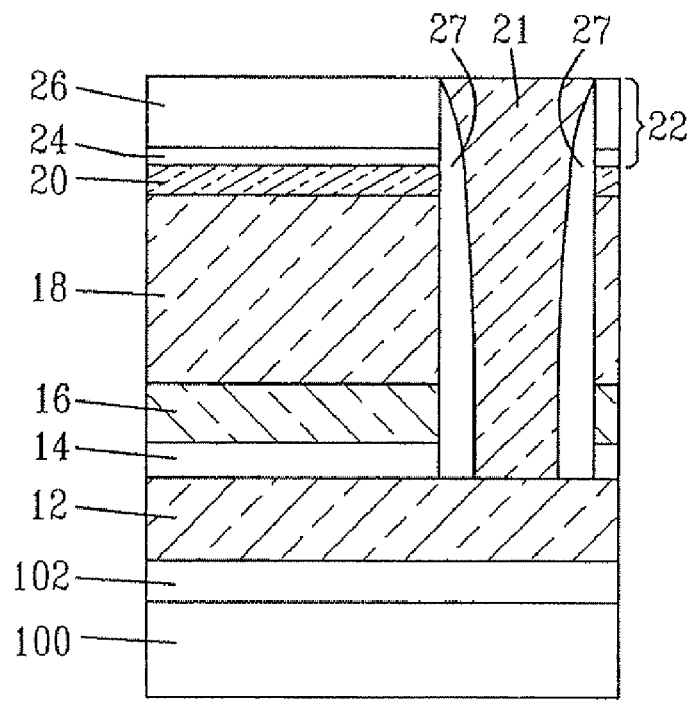
Figure 8E:
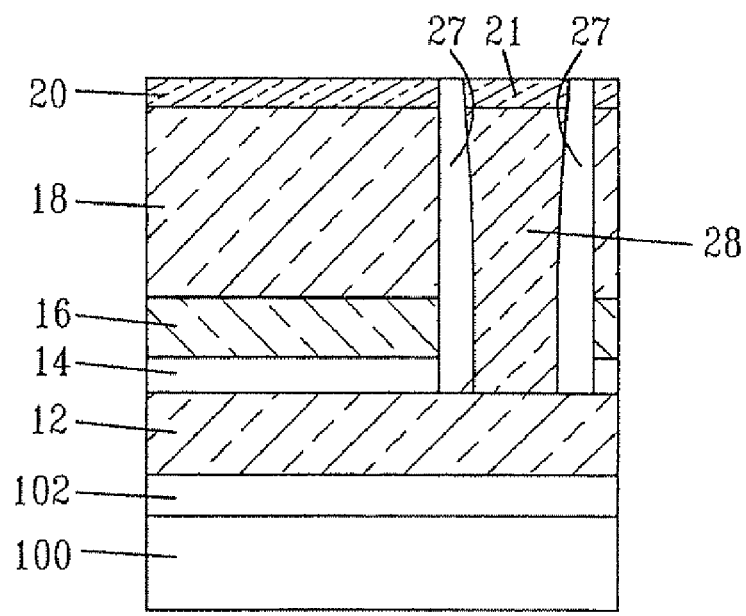

The structure shown in FIG. 8A is then subjected to the thermal mixing step described above which forms a first semiconducting layer 12 comprising a thermally mixed relaxed SiGe layer on the bottom insulating layer 102. The resultant structure that is formed after the thermal mixing step is shown, for example, in FIG. 8B. The structure shown in FIG. 8B is the bonded to a second structure that includes buried insulating layer 14 and second semiconducting layer 16. The bonding is performed as described above. The bonded structure is shown in FIG. 5C.

A relaxed SiGe alloy layer 18 and a first strained Si layer 20 is then formed atop the surface of the second semiconducting layer 16. A hard mask layer 22 comprising oxide layer 24 and nitride layer 26 is applied to a surface of the first strained Si layer 20 and thereafter the hard mask layer 22 is patterned by lithography and etching. After patterning the hard mask layer 22, an opening that extends to a surface of the thermally mixed relaxed first semiconducting layer 12 is formed by etching. Optional spacers 27 are then formed in the opening and regrown semiconductor material 28 comprising a relaxed SiGe alloy is grown on the exposed surface of the first semiconducting layer 12 that comprises thermally mixed and relaxed SiGe. The structure is then subjected to a planarization process which stops atop a surface of nitride layer 26. The resultant structure that is formed after the above processing steps have been performed is shown, for example, in FIG. 8D. In this embodiment of the present invention, the regrown SiGe alloy 28 has a crystallographic orientation that is the same as the thermally mixed relaxed SiGe layer 12.

FIG. 5E shows the structure that is formed after the regrown relaxed SiGe alloy layer 28 has been recessed, deposition of a second strained Si layer 21 on the recessed regrown semiconductor material 28 and removal of the patterned hard mask layer 22 including the nitride layer 26 and the oxide layer 24. In the strained Si-containing hybrid substrate shown in FIG. 8E, the CMOS devices are formed on strained Si layers that have different crystallographic orientations.

Figure 9A:
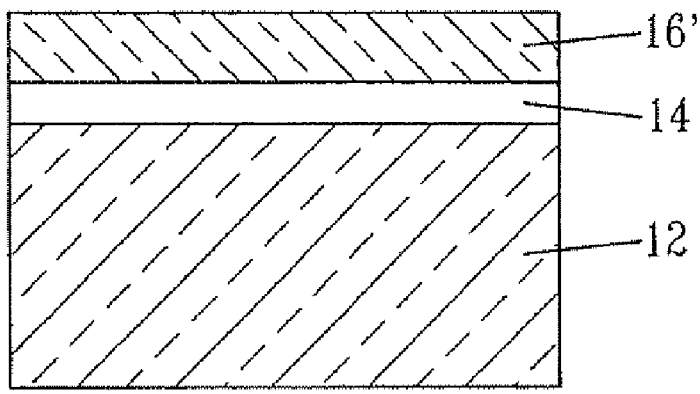
FIGS. 9A-9E are pictorial representations (through cross sectional views) showing processing steps of a ninth embodiment of the present invention.

FIGS. 9A-9E shows the processing steps that are employed in a ninth embodiment of the present invention. FIG. 9A shows an initial structure that includes first semiconducting layer 12, buried insulating layer 14, and a second sacrificial semiconducting layer 16'.

A SiGe layer 50 is then formed atop the second sacrificial semiconducting layer 16' by epitaxy. The SiGe layer 50 that is formed has the same crystallographic orientation as the second sacrificial semiconducting layer 16'. The SiGe alloy layer 50 has a thickness of about 100 nm or less. The resultant structure including the SiGe alloy layer 50 is shown in FIG. 9B.

Figure 9B:
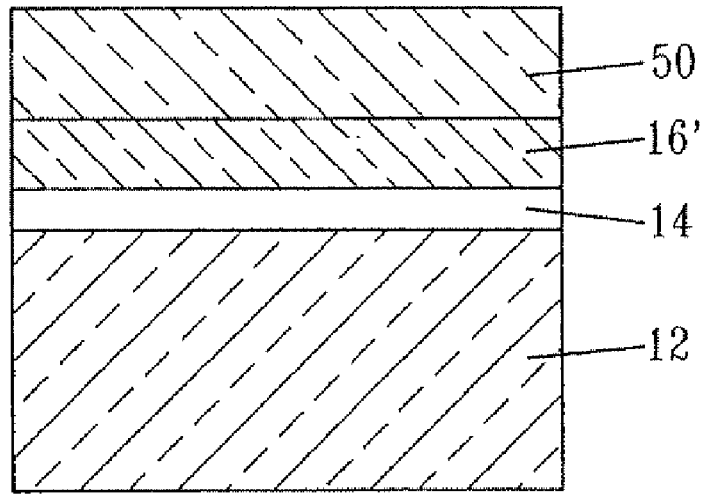

Next, the structure shown in FIG. 9B is subjected to the above described thermal mixing step so as to form a second semiconducting layer 16 that comprises a thermally mixed relaxed SiGe alloy on the buried insulating layer 14. A first strained Si layer 20 is then formed atop the second semiconducting layer 16. The resultant structure including the thermally mixed relaxed SiGe layer 16 and the strained Si layer 20 is shown in FIG. 9C.

Figure 9C:
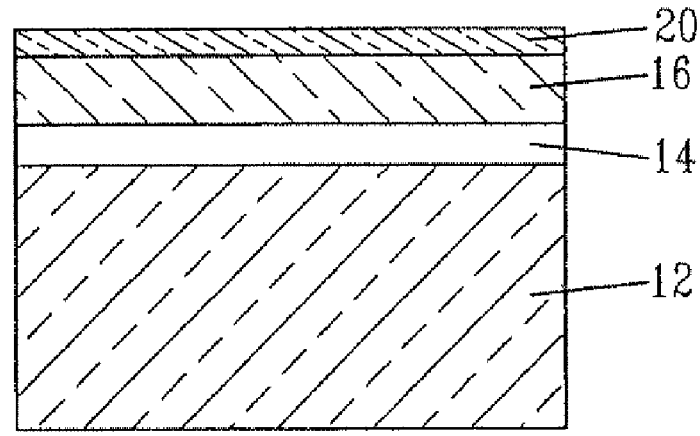
Figure 9D:
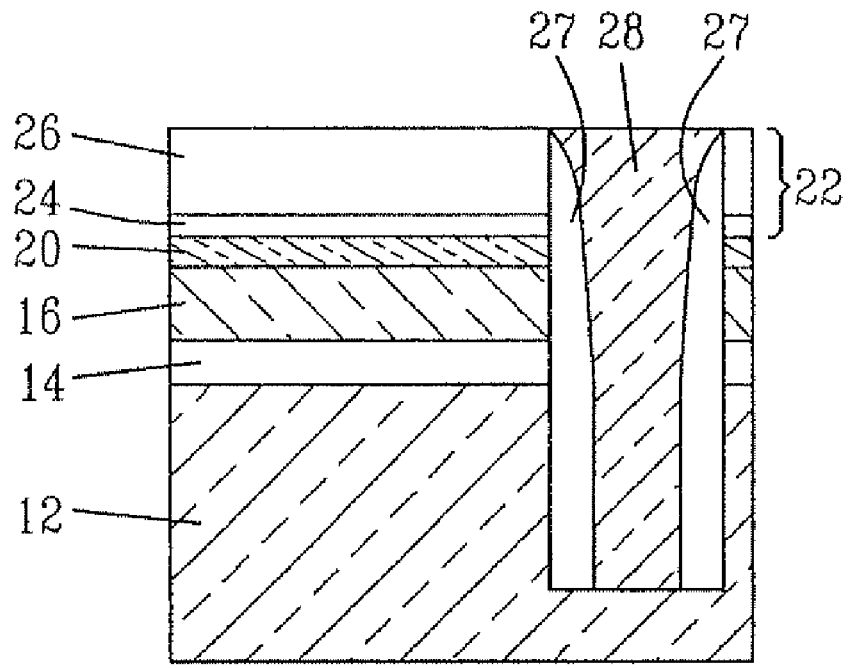

A hard mask layer 22 comprising oxide layer 24 and nitride layer 26 is applied to a surface of the strained Si layer 20 shown in FIG. 9C and thereafter the hard mask layer 22 is patterned by lithography and etching. After patterning the hard mask layer 22, an opening that extends below a surface of the first semiconducting layer 12 is formed by etching. Optional spacers 27 are then formed in the opening and regrown semiconductor material 28 comprising a relaxed SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 9D. In this embodiment of the present invention, the regrown SiGe alloy 28 has a crystallographic orientation that is the same as the first semiconducting layer 12.

Figure 9E:
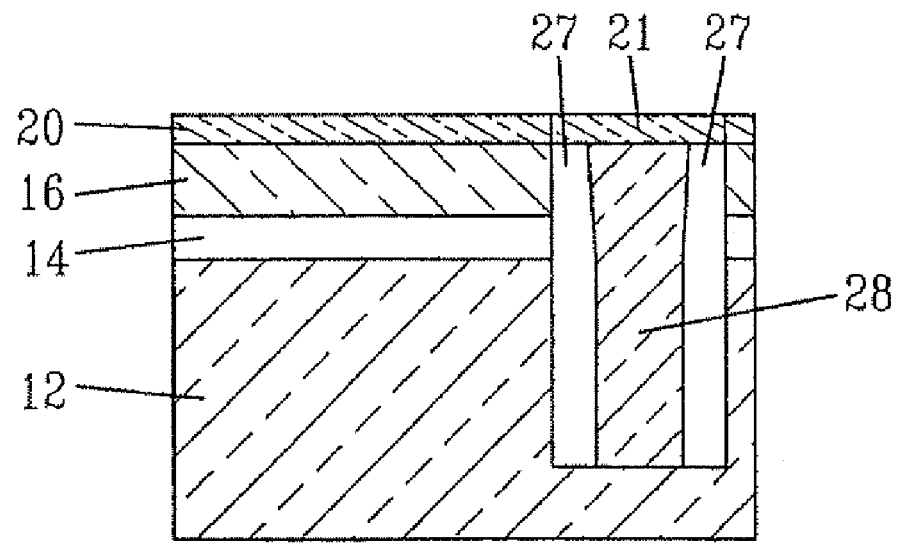

FIG. 9E shows the structure that is formed after the regrown semiconductor material 28 has been recessed, deposition of a second strained Si layer 21 on the recessed regrown semiconductor material 28 and removal of the patterned hard mask layer 22 including the nitride layer 26 and the oxide layer 24. In the strained Si-containing hybrid substrate shown in FIG. 9E, the CMOS devices are formed on strained Si layers that have different crystallographic orientations.

Figure 10A:
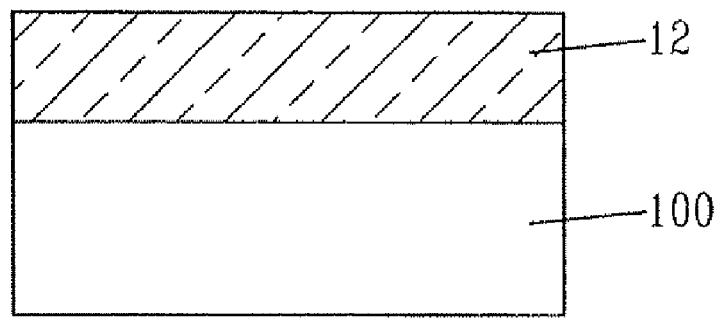
FIGS. 10A-10F are pictorial representations (through cross sectional views) showing processing steps of a tenth embodiment of the present invention.
Figure 10B:
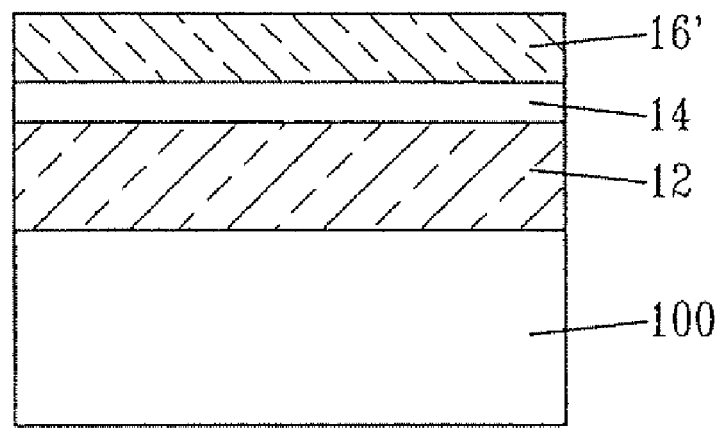

The tenth embodiment of the present invention is shown in FIGS. 10A-10F. This embodiment of the present invention, see FIG. 10A, begins by growing a SiGe layer as the first semiconducting layer 12 on the surface of a handling wafer 100. This structure is bonded to a structure that includes a buried insulating layer 14 and a second sacrificial semiconducting layer 16'. The bonding is performed as described above. The resultant structure is shown in FIG. 10B.

Figure 10C:
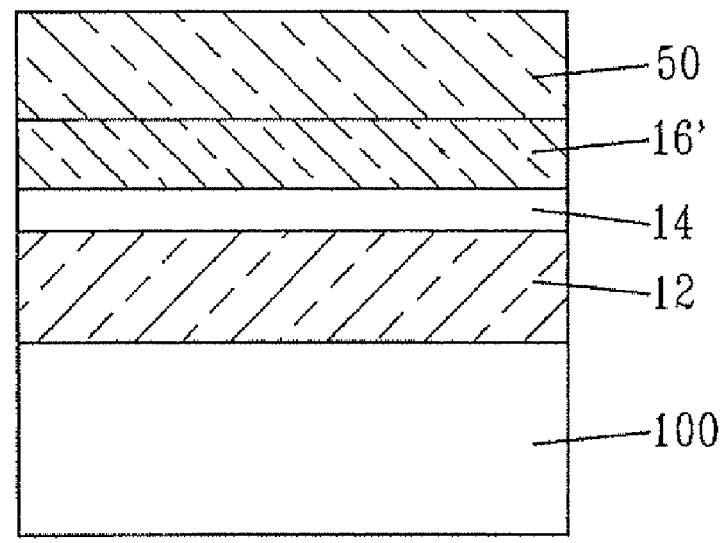

A SiGe layer 50 having the same crystallographic orientation as that of the second sacrificial semiconducting layer 16' is then formed atop the second sacrificial semiconducting layer 16' providing the structure shown, for example, in FIG. 10C. The structure shown in FIG. 10C is then subjected to the above described thermal mixing process forming a thermally mixed relaxed SiGe alloy layer as the second semiconducting layer 12 on a surface of the buried insulating layer 14.

Figure 10D:
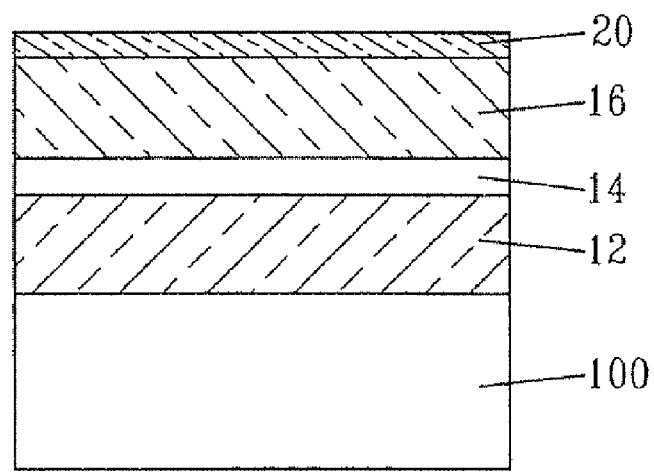
Figure 10E:
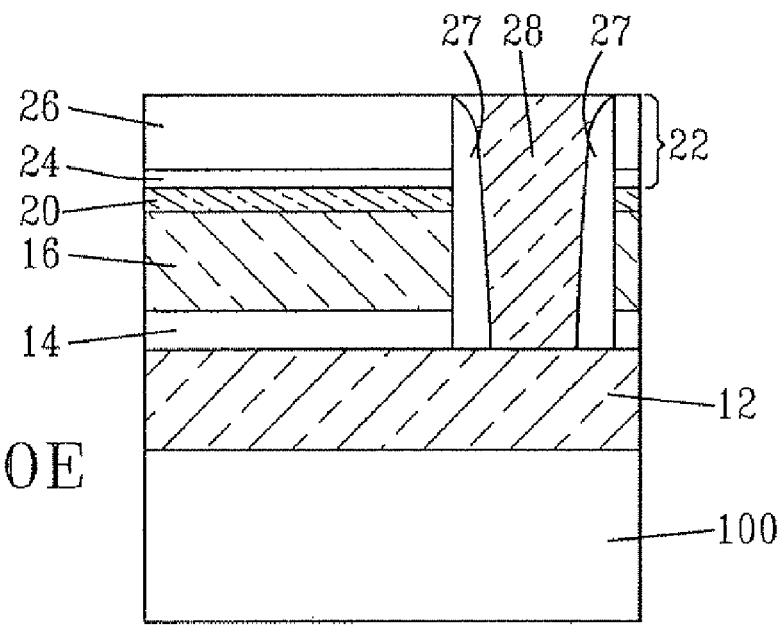

A first strained Si layer 20 is then formed atop the thermally mixed second semiconducting layer 16 providing the structure shown in FIG. 10D. The strained Si layer 20 has the same crystallographic orientation as that of the second semiconducting layer 16.

A hard mask layer 22 comprising oxide layer 24 and nitride layer 26 is applied to a surface of the strained Si layer 20 shown in FIG. 10D and thereafter the hard mask layer 22 is patterned by lithography and etching. After patterning the hard mask layer 22, an opening that extends to a surface of the first semiconducting layer 12 is formed by etching. Optional spacers 27 are then formed in the opening and regrown semiconductor material 28 comprising a relaxed SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 10E. In this embodiment of the present invention, the regrown semiconductor material 28 has a crystallographic orientation that is the same as the first semiconducting layer 12.

Figure 10F:
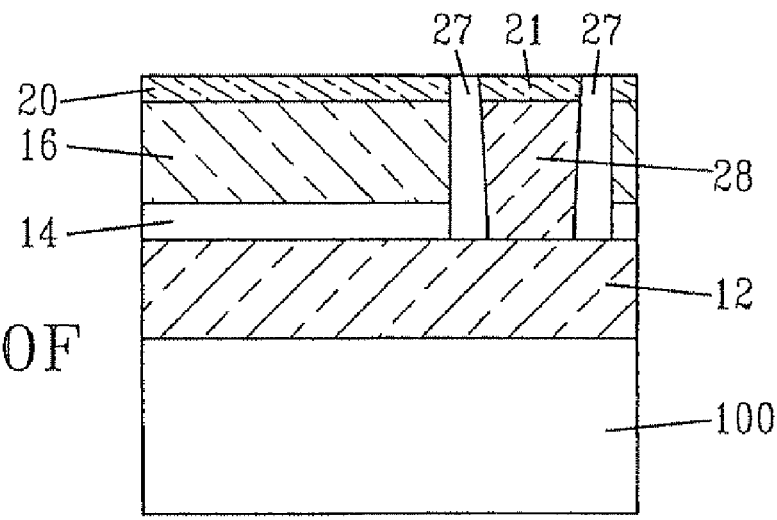

FIG. 10F shows the structure that is formed after the regrown semiconductor material 28 has been recessed, deposition of a second strained Si layer 21 on the recessed semiconductor material 28 and removal of the patterned hard mask layer 22 including the nitride layer 26 and the oxide layer 24. In the strained Si-containing hybrid substrate shown in FIG. 10F, the CMOS devices are formed on strained Si layers that have different crystallographic orientations.

Figure 11A:
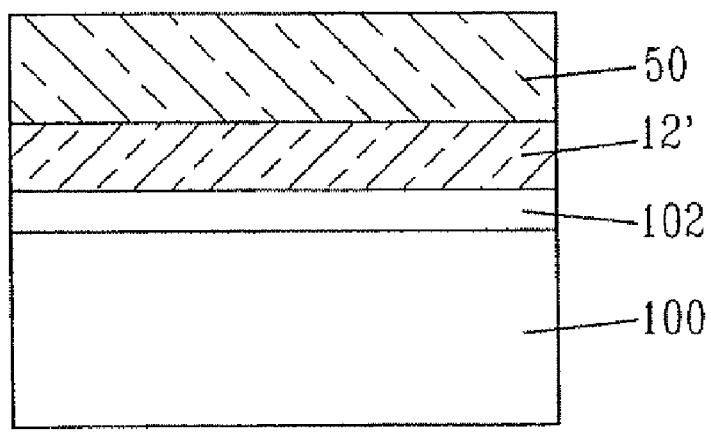
FIGS. 11A-11G are pictorial representations (through cross sectional views) showing processing steps of an eleventh embodiment of the present invention.

The eleventh embodiment of the present invention will now be described in detail by referring to FIGS. 11A-11G. FIG. 11A shows an initial structure that includes handle wafer 100, bottom insulating layer 102, first sacrificial semiconducting layer 12', and SiGe alloy layer 50. The SiGe alloy layer 50 is formed via an epitaxial growth method.

The structure shown in FIG. 11A is then subjected to the above described thermal mixing process whereby the first semiconducting layer 12 is formed. The structure after thermal mixing is shown in FIG. 11B.

Figure 11B:
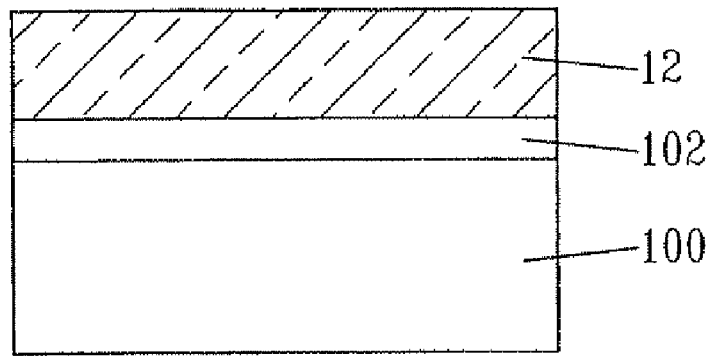
Figure 11C:
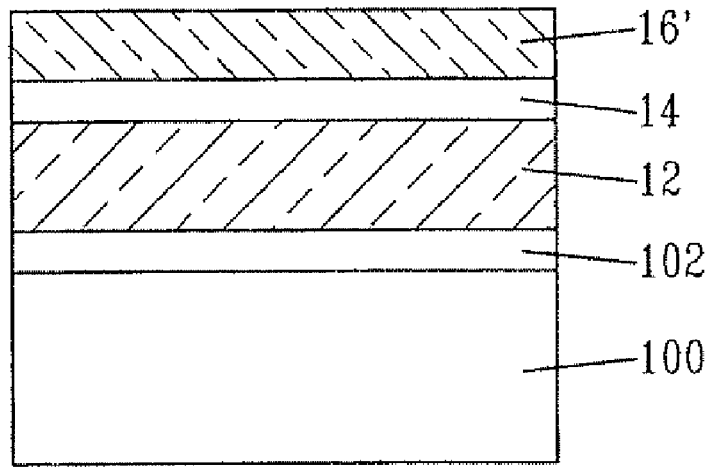

The structure of FIG. 11B is then bonded to another structure that includes buried insulating layer 14 and second sacrificial semiconducting layer 16' to provide the structure shown in FIG. 11C. The bonded structure of FIG. 11C is formed utilizing the aforementioned bonding process.

Figure 11D:
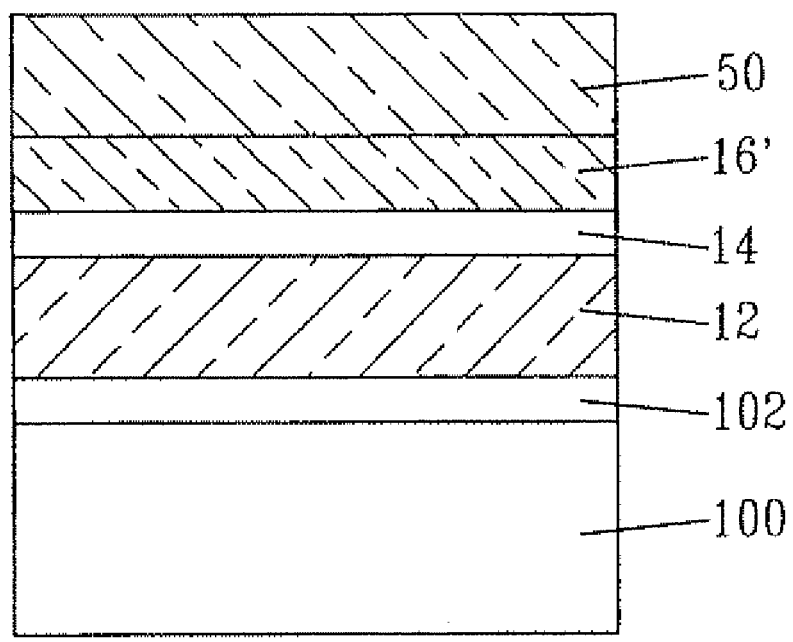

A thin SiGe alloy layer 50 having a thickness of about 100 nm or less is then formed on the second sacrificial semiconducting layer 16' providing the structure shown in FIG. 11D. This structure containing SiGe alloy layer 50 is then subjected to another thermal mixing step whereby the SiGe alloy layer 50 and the second sacrificial semiconducting layer 16' are thermally mixed and converted into the second semiconducting material 16. A first strained Si layer 20 is then formed on the thermally mixed second semiconducting layer 16. The resultant structure that is formed after these two steps have been performed is shown in FIG. 11E.

Figure 11E:
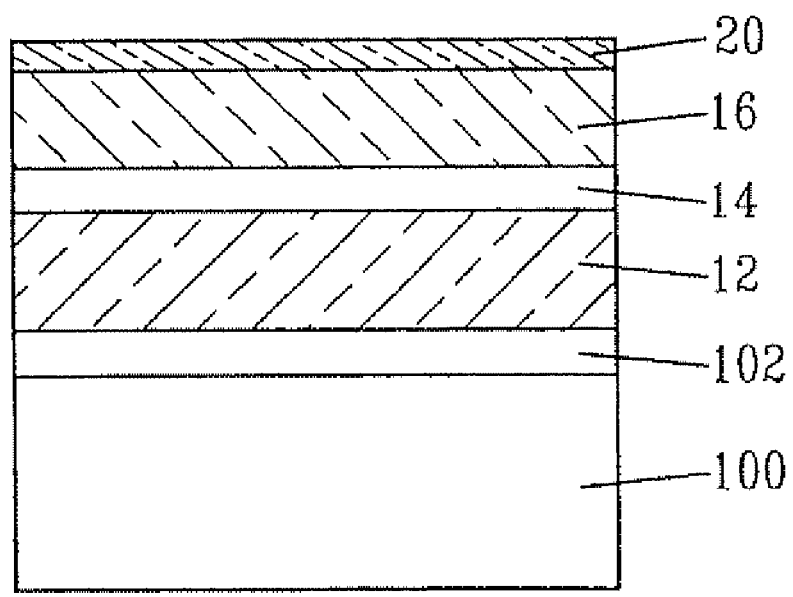
Figure 11F:
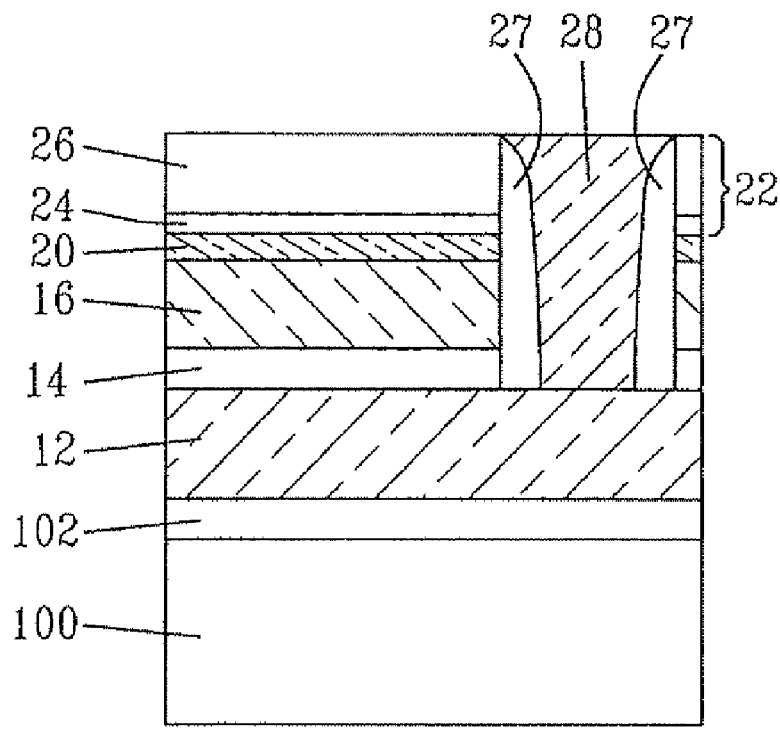

A hard mask layer 22 comprising oxide layer 24 and nitride layer 26 is applied to a surface of the first strained Si layer 20 shown in FIG. 11E and thereafter the hard mask layer 22 is patterned by lithography and etching. After patterning the hard mask layer 22, an opening that extends to a surface of the first semiconducting layer 12 is formed by etching. Optional spacers 27 are then formed in the opening and regrown semiconductor material 28 comprising a relaxed SiGe alloy is grown on the exposed surface of the first semiconducting layer 12. The structure is then subjected to a planarization process which stops atop a surface of nitride layer 26. The resultant structure that is formed after the above processing steps have been performed is shown, for example, in FIG. 11F. In this embodiment of the present invention, the regrown semiconductor 28 has a crystallographic orientation that is the same as the first semiconducting layer 12.

Figure 11G:
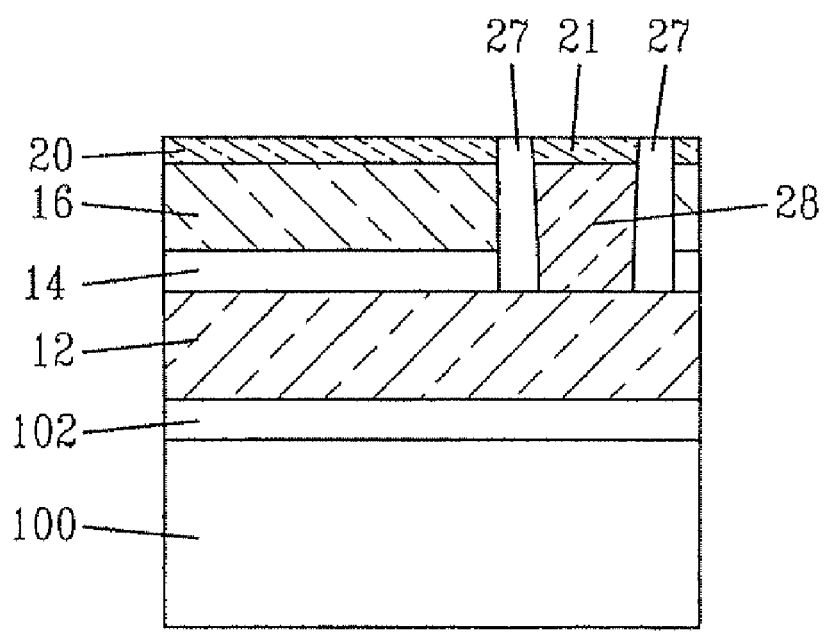

FIG. 11G shows the structure that is formed after the regrown semiconductor material 28 has been recessed, deposition of a second strained Si layer 21 on the recessed regrown semiconductor material 28 and removal of the patterned hard mask layer 22 including the nitride layer 26 and the oxide layer 24. In the strained Si-containing hybrid substrate shown in FIG. 11G, the CMOS devices are formed on strained Si layers that have different crystallographic orientations.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a strained Si-containing hybrid substrate comprising:

providing a hybrid substrate comprising a first semiconducting layer of a first crystallographic orientation, a buried insulating layer located on a surface of the first semiconductor layer and a second semiconducting layer of a second crystallographic orientation which is different from the first crystallographic orientation located on said buried insulating layer;

providing an opening that extends to a surface of the first semiconducting layer, wherein said providing said opening comprises forming a patterned hard mask layer atop said hybrid substrate and etching; and regrowing a semiconductor material on said first semiconducting layer in said opening, said semiconductor material having the first crystallographic orientation, with the provision that a strained Si layer is formed overlying at least one of the second semiconducting layer or the regrown semiconductor material, said Si layer having a crystallographic orientation that matches that of said underlying second semiconducting layer or the regrown semiconductor material.

2. The method of claim 1 wherein the providing the hybrid substrate comprises a layer transfer technique and bonding.

3. The method of claim 2 wherein the bonding is performed by bringing two semiconductor wafers into intimate contact with each other, optionally applying an external force to the contacted wafers, and heating.

4. The method of claim 1 wherein at least one of the first or second semiconducting layers is formed via a thermal mixing process which converts a sacrificial semiconducting layer and an overlying SiGe alloy layer into a thermally mixed relaxed SiGe alloy layer.

5. The method of claim 4 wherein both the first and second semiconducting layers are formed by said thermal mixing.

6. The method of claim 5 wherein said thermal mixing is performed in an oxygen-containing ambient at a temperature from about 900° C. to about 1350° C.

7. The method of claim 1 wherein prior to providing said opening a relaxed SiGe alloy layer and a strained Si layer are formed atop the second semiconducting layer.

8. The method of claim 1 wherein the regrown semiconductor is non-recessed after regrowth.

9. The method of claim 1 wherein the regrown semiconductor material is recessed after regrowth and the strained Si layer is formed thereon.

10. The method of claim 1 wherein said strained Si layer is provided above said second semiconducting layer.

11. The method of claim 1 wherein said strained Si layer is provided above said regrown semiconductor material.

12. The method of claim 1 wherein said strained Si layers are provided above second semiconducting layer and above the regrown semiconductor material.

13. The method of claim 1 wherein optional spacers are formed within said opening prior to regrowth.

14. The method of claim 1 further comprising forming device isolation regions in said strained Si-containing hybrid substrate.

15. The method of claim 1 further comprising forming CMOS devices on said strained Si-containing hybrid substrate.

16. The method of claim 15 wherein the CMOS devices are nFETs, said nFETs are formed atop a strained Si layer having a (100) surface orientation.

17. A method of fabricating a strained Si-containing hybrid substrate comprising:

providing a hybrid substrate comprising a first semiconducting layer of a first crystallographic orientation, a buried insulating layer located on a surface of the first semiconductor layer and a second semiconducting layer of a second crystallographic orientation which is different from the first crystallographic orientation located on said buried insulating layer;

providing an opening that extends to a surface of the first semiconducting layer; and regrowing a semiconductor material on said first semiconducting layer in said opening, said semiconductor material having the first crystallographic orientation, with the provision that a strained Si layer is formed overlying at least one of the second semiconducting layer or the regrown semiconductor material, said Si layer having a crystallographic orientation that matches that of said underlying second semiconducting layer or the regrown semiconductor material, arid the semiconductor material is non-recessed after regrowing.

18. A method of fabricating a strained Si-containing hybrid substrate comprising:

providing a hybrid substrate comprising a first semiconducting layer of a first crystallographic orientation, a buried insulating layer located on a surface of the first semiconductor layer and a second semiconducting layer of a second crystallographic orientation which is different from the first crystallographic orientation located on said buried insulating layer;

providing an opening that extends to a surface of the first semiconducting layer; and regrowing a semiconductor material on said first semiconducting layer in said opening, said semiconductor material having the first crystallographic orientation, with the provision that said Si layer having a crystallographic orientation that matches that of said underlying second semiconducting layer or the regrown semiconductor material;

recessing the regrown semiconductor material; and forming a strained Si layer on the recessed regrown semiconductor material.

* * * * *